United States Patent
Chang et al.

(10) Patent No.: US 12,040,368 B2
(45) Date of Patent: Jul. 16, 2024

(54) SEMICONDUCTOR DEVICE AND MANUFACTURING METHOD THEREOF

(71) Applicant: INNOSCIENCE (SUZHOU) SEMICONDUCTOR CO., LTD., Suzhou (CN)

(72) Inventors: Ming-Hong Chang, Zhuhai (CN); Jian Rao, Zhuhai (CN); Yulong Zhang, Zhuhai (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 759 days.

(21) Appl. No.: 17/253,104

(22) PCT Filed: Nov. 30, 2020

(86) PCT No.: PCT/CN2020/132793
§ 371 (c)(1),
(2) Date: Dec. 16, 2020

(87) PCT Pub. No.: WO2022/110149
PCT Pub. Date: Jun. 2, 2022

(65) Prior Publication Data
US 2022/0376066 A1    Nov. 24, 2022

(51) Int. Cl.
*H01L 29/417* (2006.01)
*H01L 23/31* (2006.01)
(Continued)

(52) U.S. Cl.
CPC .... *H01L 29/41775* (2013.01); *H01L 23/3171* (2013.01); *H01L 23/3192* (2013.01);
(Continued)

(58) Field of Classification Search
CPC ............ H01L 23/3171; H01L 23/3912; H01L 29/7786; H01L 29/66462; H01L 29/41775;
(Continued)

(56) References Cited

U.S. PATENT DOCUMENTS

2007/0018199 A1*  1/2007  Sheppard .......... H01L 29/66462
                                                      257/E29.127
2008/0128753 A1   6/2008  Parikh et al.
(Continued)

FOREIGN PATENT DOCUMENTS

CN    111758166 A    10/2020
CN    111883588 A    11/2020
(Continued)

OTHER PUBLICATIONS

Notice of Allowance of the corresponding China patent application No. 202080003533.9 dated Jun. 1, 2022.
First Office Action of the corresponding China patent application No. 202080003533.9 dated Mar. 16, 2022.
International Search Report and Written Opinion of the corresponding PCT application No. PCT/CN2020/132793 dated Aug. 26, 2021.

*Primary Examiner* — Vongsavanh Sengdara
(74) *Attorney, Agent, or Firm* — JCIPRNET

(57) ABSTRACT

Some embodiments of the disclosure provide a semiconductor device. The semiconductor device comprises: a substrate; a first nitride semiconductor layer disposed on the substrate; a second nitride semiconductor layer disposed on the first nitride semiconductor layer and having a bandgap greater than that of the first nitride semiconductor layer; an ohmic contact disposed on the first nitride semiconductor layer; and a spacer disposed adjacent to a sidewall of the ohmic contact.

16 Claims, 25 Drawing Sheets

(51) Int. Cl.
  *H01L 29/20*   (2006.01)
  *H01L 29/205*  (2006.01)
  *H01L 29/40*   (2006.01)
  *H01L 29/66*   (2006.01)
  *H01L 29/778*  (2006.01)

(52) U.S. Cl.
  CPC ........ *H01L 29/2003* (2013.01); *H01L 29/205* (2013.01); *H01L 29/401* (2013.01); *H01L 29/66462* (2013.01); *H01L 29/7786* (2013.01)

(58) Field of Classification Search
  CPC ................ H01L 29/401; H01L 29/205; H01L 29/2003
  See application file for complete search history.

(56) References Cited

U.S. PATENT DOCUMENTS

| | | | |
|---|---|---|---|
| 2013/0134482 | A1 | 5/2013 | Yu et al. |
| 2013/0307026 | A1* | 11/2013 | Hwang ............... H01L 29/7787 |
| | | | 257/194 |
| 2014/0299989 | A1 | 10/2014 | Lim et al. |
| 2015/0060873 | A1 | 3/2015 | Chiu et al. |
| 2016/0013305 | A1 | 1/2016 | Fujita |
| 2016/0020313 | A1 | 1/2016 | Wu et al. |
| 2018/0323296 | A1 | 11/2018 | Iucolano et al. |
| 2019/0157440 | A1 | 5/2019 | Green et al. |

FOREIGN PATENT DOCUMENTS

| | | |
|---|---|---|
| JP | 76974 A | 1/1995 |
| JP | 201223383 A | 2/2012 |

* cited by examiner

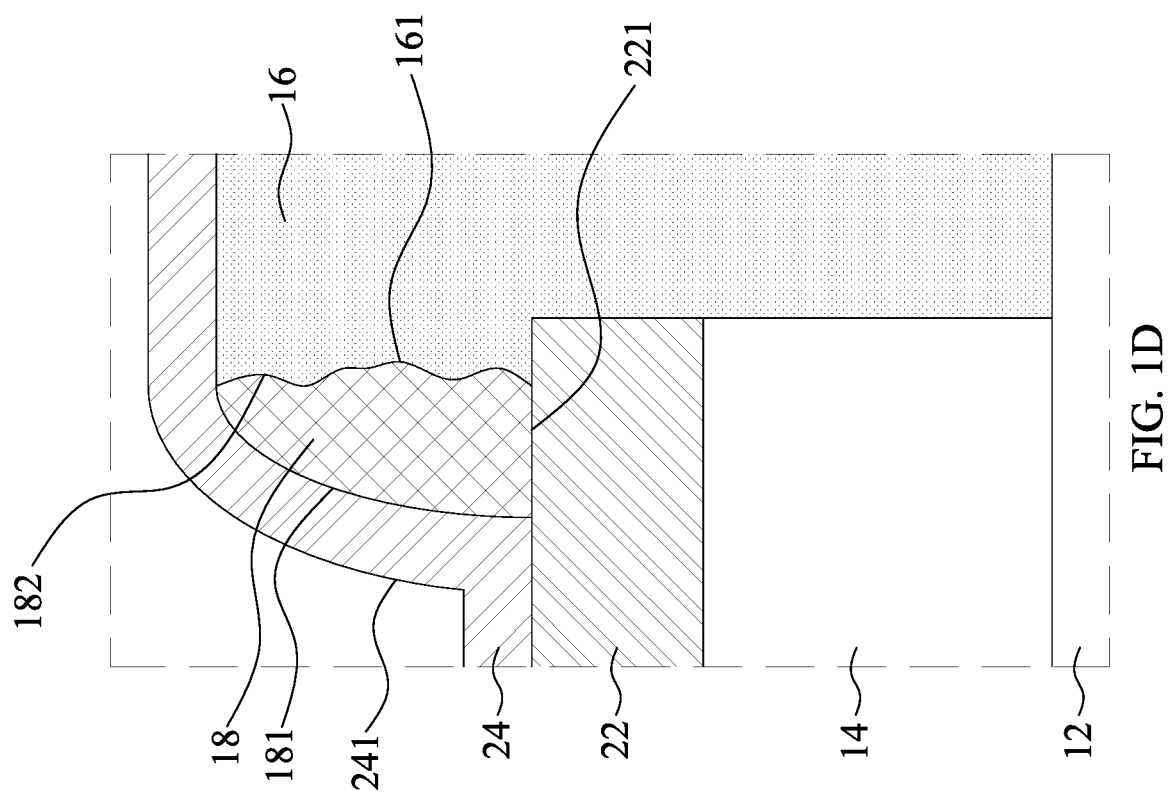

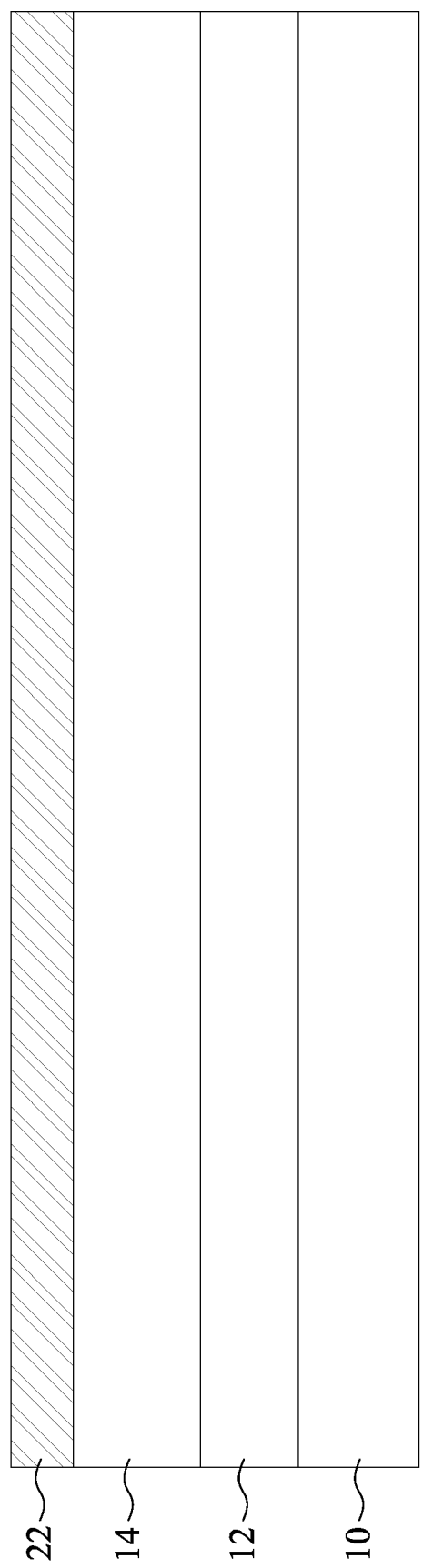

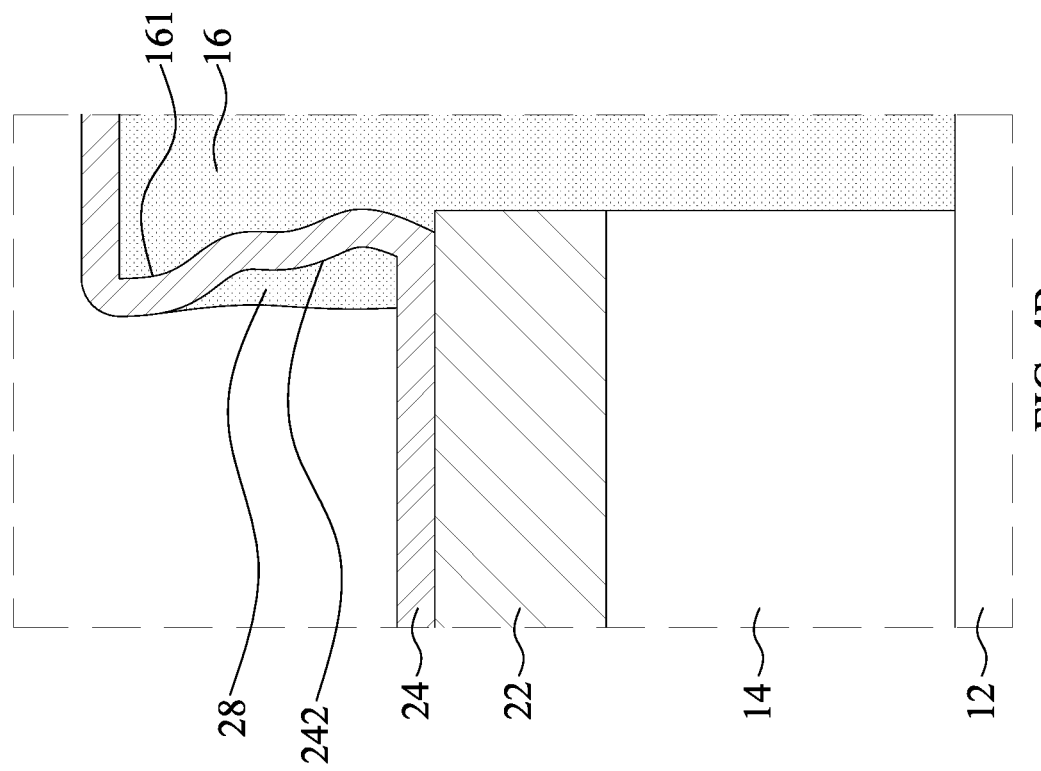

SEMICONDUCTOR DEVICE AND MANUFACTURING METHOD THEREOF

TECHNICAL FIELD

The disclosure is related to a semiconductor device, and in particular, to a semiconductor device including a high-electron-mobility transistor (HEMT).

BACKGROUND

A semiconductor component including a direct bandgap, for example, a semiconductor component including a III-V material or III-V compounds, may operate or work under a variety of conditions or environments (for example, different voltages or frequencies) due to its characteristics.

The foregoing semiconductor component may include a HEMT, a heterojunction bipolar transistor (HBT), a heterojunction field effect transistor (HFET), or a modulation-doped field effect transistor (MODFET).

SUMMARY OF THE INVENTION

Some embodiments of the disclosure provide a semiconductor device. The semiconductor device comprises: a substrate; a first nitride semiconductor layer disposed on the substrate; a second nitride semiconductor layer disposed on the first nitride semiconductor layer and having a bandgap greater than that of the first nitride semiconductor layer; an ohmic contact disposed on the first nitride semiconductor layer; and a spacer disposed adjacent to a sidewall of the ohmic contact.

Some embodiments of the disclosure provide a semiconductor device. The semiconductor device comprises: a substrate; a first nitride semiconductor layer disposed on the substrate; a second nitride semiconductor layer disposed on the first nitride semiconductor layer and having a bandgap greater than that of the first nitride semiconductor layer; an ohmic contact disposed on the first nitride semiconductor layer; a first passivation layer disposed on the second nitride semiconductor layer; and a second passivation layer disposed on the ohmic contact and the first passivation layer; wherein a void is defined between the ohmic contact and the second passivation layer.

Some embodiments of the disclosure provide a method for fabricating a semiconductor device. The method comprises: providing a semiconductor stack comprising a substrate, a first nitride semiconductor layer on the substrate, and a second nitride semiconductor layer on the first nitride semiconductor layer, wherein the second nitride semiconductor layer having a bandgap greater than that of the first nitride semiconductor layer; forming a first contact on the first nitride semiconductor layer; forming a spacer attached to a sidewall of the first contact; and forming a second contact after the spacer is formed.

BRIEF DESCRIPTION OF THE DRAWINGS

Aspects of the disclosure will become more comprehensible from the following detailed description made with reference to the accompanying drawings. It should be noted that, various features may not be drawn to scale. In fact, the sizes of the various features may be increased or reduced arbitrarily for the purpose of clear description.

FIG. 1D is an enlarged side view of a semiconductor structure according to some embodiments of the disclosure;

FIG. 2A, FIG. 2B, FIG. 2C, FIG. 2D, FIG. 2E, FIG. 2F, and FIG. 2G show several operations for manufacturing a semiconductor device according to some embodiments of the disclosure;

FIG. 4B is an enlarged side view of a semiconductor structure according to some embodiments of the disclosure.

PREFERRED EMBODIMENT OF THE PRESENT INVENTION

Figure 1A:
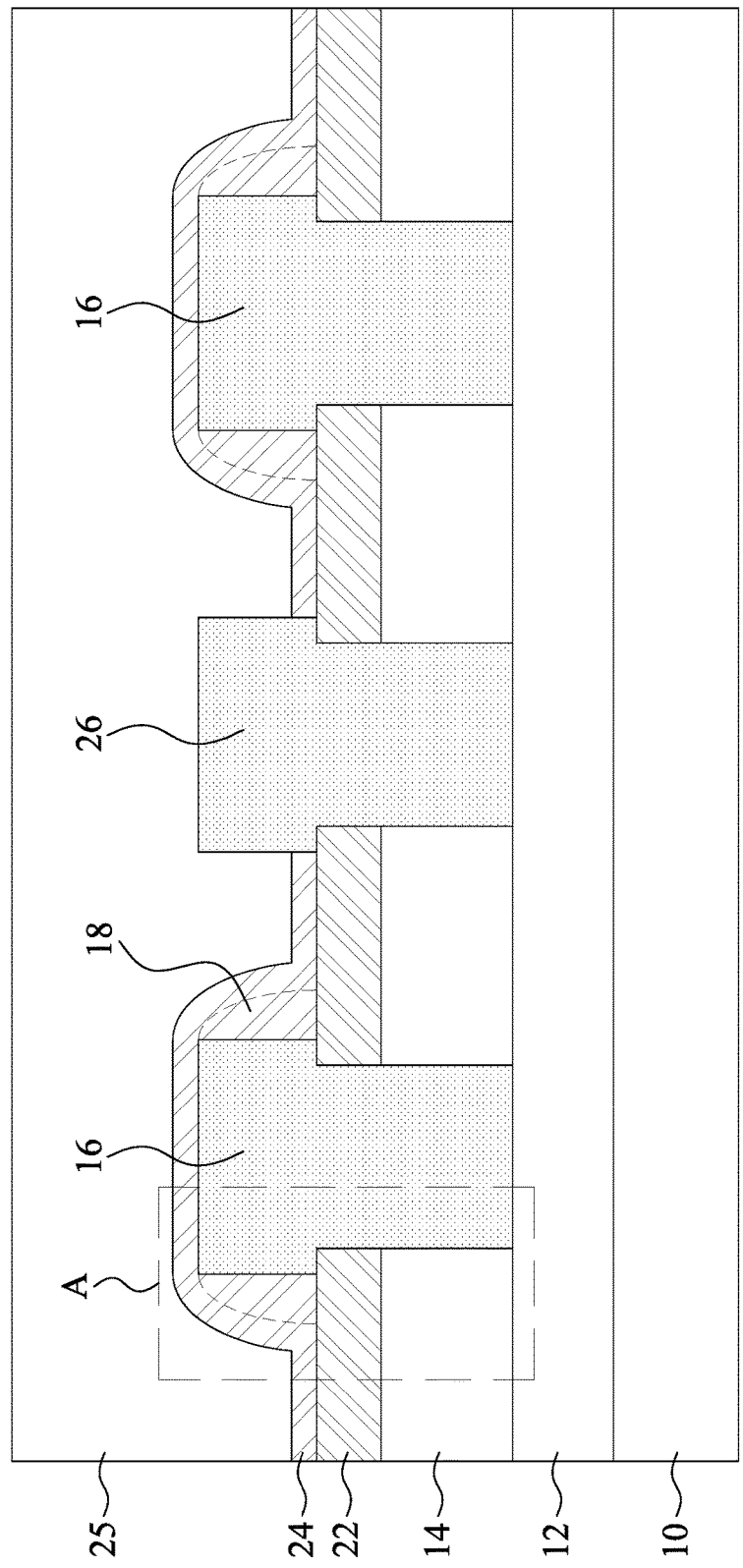
FIG. 1A is a side view of a semiconductor device according to some embodiments of the disclosure.

The following disclosure provides many different embodiments or examples for implementing different features of the provided subject matter. Specific examples of components and arrangements are described below. Certainly, these descriptions are merely examples and are not intended to be limiting. In the disclosure, in the following descriptions, the description of the first feature being formed on or above the second feature may include an embodiment in which the first feature and the second feature are formed to be in direct contact, and may further include an embodiment in which an additional feature may be formed between the first feature and the second feature to enable the first feature and the second feature to be not in direct contact. In addition, in the disclosure, reference numerals and/or letters may be repeated in examples. This repetition is for the purpose of simplification and clarity, and does not indicate a relationship between the described various embodiments and/or configurations.

The embodiments of the disclosure are described in detail below. However, it should be understood that many applicable concepts provided by the disclosure may be implemented in a plurality of specific environments. The described specific embodiments are only illustrative and do not limit the scope of the disclosure.

A direct bandgap material, such as a III-V compound, may include but is not limited to, for example, gallium arsenide (GaAs), indium phosphide (InP), gallium nitride (GaN), Indium gallium arsenide (InGaAs), Indium aluminum arsenide (InAlAs), or the like.

FIG. 1A is a side view of a semiconductor device 1 according to some embodiments of the disclosure.

As shown in FIG. 1A, the semiconductor device 1 may include a substrate 10, a semiconductor layer 12, a semiconductor layer 14, a conductive structure 16, a spacer 18, a passivation layer 22, another passivation layer 24, yet another passivation layer 25, and a conductive structure 16.

The substrate 10 may include, for example, but is not limited to, silicon (Si), doped silicon (doped Si), silicon carbide (SiC), germanium silicide (SiGe), gallium arsenide (GaAs), or other suitable material(s). For example, in some embodiments, the substrate 10 may include an intrinsic semiconductor material. For example, in some other embodiments, the substrate 10 may include a p-type semiconductor material. For example, in some other embodiments, the substrate 10 may include a silicon layer doped with boron (B). For example, in some other embodiments, the substrate 10 may include a silicon layer doped with gallium (Ga). For example, in some other embodiments, the substrate 10 may include an n-type semiconductor material. For example, in some other embodiments, the substrate 10 may include a silicon layer doped with arsenic (As). For example, in some other embodiments, the substrate 10 may include a silicon layer doped with phosphorus (P).

The semiconductor layer 12 may be disposed on the substrate 10. The semiconductor layer 12 may include a III-V material. The semiconductor layer 12 may be a nitride semiconductor layer. The semiconductor layer 12 may include, for example, but is not limited to, III nitride. The semiconductor layer 12 may include, for example, but is not limited to, GaN. The semiconductor layer 12 may include, for example, but is not limited to, AlN. The semiconductor layer 12 may include, for example, but is not limited to, InN. The semiconductor layer 12 may include, for example, but is not limited to, compound $In_xAl_yGa_{1-x-y}N$, where $x+y \leq 1$. The semiconductor layer 12 may include, for example, but is not limited to, compound $Al_yGa_{(1-y)}N$, where $y \leq 1$.

A buffer layer or nucleation layer (not shown in FIG. 1A) can be formed or disposed between the substrate 10 and the semiconductor layer 12. The buffer layer can include nitrides. In some embodiments, the buffer layer may include, for example, but is not limited to, aluminum nitride (AlN) or other suitable material(s). In some other embodiments, the buffer layer may include, for example, but is not limited to, aluminum gallium nitride (AlGaN) or other suitable material(s). The buffer layer may include a multilayer structure. The buffer layer may include a superlattice structure of a cyclical stack of two or more materials. The buffer layer may include a single layer structure.

The semiconductor layer 14 may be disposed on the semiconductor layer 12. The semiconductor layer 14 may include a III-V material. The semiconductor layer 14 may be a nitride semiconductor layer. The semiconductor layer 14 may include, for example, but is not limited to, III nitride. The semiconductor layer 14 may include, for example, but is not limited to, compound $Al_yGa_{(1-y)}N$, where $y \leq 1$. The semiconductor layer 14 may include, for example, but is not limited to, GaN. The semiconductor layer 14 may include, for example, but is not limited to, AlN. The semiconductor layer 14 may include, for example, but is not limited to, InN. The semiconductor layer 14 may include, for example, but is not limited to, compound $In_xAl_yGa_{1-x-y}N$, where $x+y \leq 1$.

A heterojunction may be formed between the semiconductor layer 14 and the semiconductor layer 12. The semiconductor layer 14 may have a bandgap greater than a bandgap of the semiconductor layer 12. For example, the semiconductor layer 14 may include AlGaN that may have a bandgap of about 4 eV, and the semiconductor layer 12 may include GaN that may have a bandgap of about 3.4 eV.

In the semiconductor device 1, the semiconductor layer 12 may function as a channel layer. In the semiconductor device 1, the semiconductor layer 12 may function as a channel layer disposed on the substrate 10. In the semiconductor device 1, the semiconductor layer 14 may function as a barrier layer. In the semiconductor device 1, the semiconductor layer 14 may function as a barrier layer disposed on the semiconductor layer 12.

In the semiconductor device 1, the bandgap of the semiconductor layer 12 can be less than the bandgap of the semiconductor layer 14 to form two dimensional electron gas (2DEG) in the semiconductor layer 12. In the semiconductor device 1, the bandgap of the semiconductor layer 12 can be less than the bandgap of the semiconductor layer 14 to form 2DEG in the semiconductor layer 12, and the 2DEG is close or adjacent to the interface (or boundary) between the semiconductor layer 14 and the semiconductor layer 12. In the semiconductor device 1, the bandgap of the semiconductor layer 14 can be greater than the bandgap of the semiconductor layer 12 to form 2DEG in the semiconductor layer 12. In the semiconductor device 1, the bandgap of the semiconductor layer 14 can be greater than the bandgap of the semiconductor layer 12 to form 2DEG in the semiconductor layer 12, and the 2DEG is close or adjacent to the interface (or boundary) between the semiconductor layer 14 and the semiconductor layer 12.

The conductive structure 16 may be disposed on the semiconductor layer 12. The conductive structure 16 may be surrounded by the semiconductor layer 14. The conductive structure 16 may be surrounded by the spacer 18. The conductive structure 16 may be surrounded by the passivation layer 22. The conductive structure 16 may be surrounded by the passivation layer 24. The conductive structure 16 may include a conductive material. The conductive structure 16 may include a semiconductive material. The conductive structure 16 may include a metal. The conductive structure 16 may include, for example, but is not limited to, Al, Ti, and Si or other suitable material(s).

In the semiconductor device 1, the conductive structure 16 may function as, for example, but is not limited to, a drain conductor. In the semiconductor device 1, the conductive structure 16 may function as, for example, but is not limited to, a source conductor. In the semiconductor device 1, the conductive structure 16 may have an ohmic contact for a drain conductor. In the semiconductor device 1, the conductive structure 16 may have an ohmic contact for a source conductor.

The spacer 18 may be located on the semiconductor layer 14. The spacer 18 may be disposed on the passivation layer 22. The spacer 18 is standing on the passivation layer 22. The spacer 18 may be in direct contact with the passivation layer 22. The spacer 18 may cover a sidewall of the conductive structure 16 (not denoted in FIG. 1A). The spacer 18 may cover both sidewalls of the conductive structure 16 (not denoted in FIG. 1A). The spacer 18 may surround the conductive structure 16. The spacer 18 may enclose the conductive structure 16. The spacer 18 may be in direct contact with a sidewall of the conductive structure 16 (not denoted in FIG. 1A). The spacer 18 may be in direct contact with both sidewalls of the conductive structure 16 (not denoted in FIG. 1A). The spacer 18 may include a dielectric material. The spacer 18 may include an insulation material. The spacer 18 may include nitride. The spacer 18 may include, for example, but is not limited to, silicon nitride ($Si_3N_4$) or other suitable material(s). The spacer 18 may include oxide. The spacer 18 may include, for example, but is not limited to, silicon oxide ($SiO_2$) or other suitable material(s). The spacer 18 may electrically isolate the conductive structure 16. The spacer 18 may be heat resistant. The spacer 18 can endure a temperature above 600° C. The spacer 18 can endure a temperature above 800° C. The spacer 18 can endure a temperature above 1000° C.

The passivation layer 22 may be disposed on the semiconductor layer 14. The passivation layer 22 may surround the conductive structure 16. The passivation layer 22 may have a portion covered by the conductive structure 16. The passivation layer 22 may surround the conductive structure 26. The passivation layer 22 may have a portion under the conductive structure 26. The passivation layer 22 may include a dielectric material. The passivation layer 22 may include nitride. The passivation layer 22 may include, for example, but is not limited to, silicon nitride ($Si_3N_4$) or other suitable material(s). The passivation layer 22 may include oxide. The passivation layer 22 may include, for example, but is not limited to, silicon oxide ($SiO_2$) or other suitable material(s). The passivation layer 22 may electrically isolate the conductive structure 16. The passivation layer 22 may electrically isolate the conductive structure 26.

The passivation layer 24 may be disposed on the passivation layer 22. The passivation layer 24 may surround the conductive structure 16. The passivation layer 24 may cover the conductive structure 16. The passivation layer 24 may surround the spacer 18. The passivation layer 24 can be in direct contact with the spacer 18. The passivation layer 24 may cover the spacer 18. The passivation layer 24 may surround the conductive structure 26. The passivation layer 24 may have a portion covered by the conductive structure 26. The passivation layer 24 may include a dielectric material. The passivation layer 24 may include nitride. The passivation layer 24 may include, for example, but is not limited to, silicon nitride ($Si_3N_4$) or other suitable material(s). The passivation layer 24 may include oxide. The passivation layer 24 may include, for example, but is not limited to, silicon oxide ($SiO_2$) or other suitable material(s). The passivation layer 24 may electrically isolate the conductive structure 16. The passivation layer 24 may electrically isolate the conductive structure 26.

The conductive structure 26 may be disposed on the semiconductor layer 14. The conductive structure 26 may include a metal. The conductive structure 26 may include, for example, but is not limited to, gold (Au), platinum (Pt), titanium (Ti), palladium (Pd), nickel (Ni), tungsten (W) or other suitable material(s). The conductive structure 26 may include a metal compound. The conductive structure 26 may include, for example, but is not limited to, titanium nitride (TiN) or other suitable material(s).

The passivation layer 25 may be disposed on the passivation layer 24. The passivation layer 25 may be disposed on the conductive structure 26. The passivation layer 25 may cover the passivation layer 24. The passivation layer 25 may cover the conductive structure 26. The passivation layer 25 can be in direct contact with the passivation layer 24. The passivation layer 25 may include a dielectric material. The passivation layer 25 may include nitride. The passivation layer 25 may include, for example, but is not limited to, silicon nitride ($Si_3N_4$) or other suitable material(s). The passivation layer 25 may include oxide. The passivation layer 25 may include, for example, but is not limited to, silicon oxide ($SiO_2$) or other suitable material(s). The passivation layer 25 may electrically isolate the conductive structure 26.

The passivation layer 25 may have a material identical to that of the passivation layer 24. The passivation layer 25 and the passivation layer 24 may have the same material. In the case that the passivation layer 25 and the passivation layer 24 have the same material, no interface can be observed between the passivation layer 25 and the passivation layer 24. In the case that the passivation layer 25 and the passivation layer 24 have the same material, the passivation layer 25 and the passivation layer 24 may be regarded as a single passivation layer.

The passivation layer 25 may have a material different from that of the passivation layer 24. The passivation layer 25 and the passivation layer 24 may have different materials. In the case that the passivation layer 25 and the passivation layer 24 have different materials, an interface can be observed between the passivation layer 25 and the passivation layer 24. In the case that the passivation layer 25 and the passivation layer 24 have different materials, a convex surface of the passivation layer 24 towards the passivation layer 25 can be observed.

In the semiconductor device 1, the conductive structure 26 may function as a gate conductor. In the semiconductor device 1, the conductive structure 26 may be configured to control the 2DEG in the semiconductor layer 12. In the semiconductor device 1, a voltage may be applied to the conductive structure 26 to control the 2DEG in the semiconductor layer 12. In the semiconductor device 1, a voltage may be applied to the conductive structure 26 to control the 2DEG in the semiconductor layer 12 and below the conductive structure 26. In the semiconductor device 1, a voltage may be applied to the conductive structure 26 to control the connection or disconnection between the conductive structures 16.

In some other embodiments, the semiconductor device 1 can further include a doped semiconductor layer between the semiconductor layer 14 and the conductive structure 26 (not shown in FIG. 1A). The doped semiconductor layer may include a doped III-V material. The doped semiconductor layer may include a p-type III-V material. The doped semiconductor layer may include, for example, but is not limited to, p-type III nitride. The doped semiconductor layer may include, for example, but is not limited to, p-type GaN. The doped semiconductor layer may implement an enhancement-mode semiconductor device.

In some embodiments, the conductive structure 16 may function as a source conductor or a drain conductor of the semiconductor device 1 and the conductive structure 26 may function as a gate conductor of the semiconductor device 1. Although the conductive structure 26 that may function as a gate conductor is located between the conductive structures 16 which may function as a source conductor and a drain conductor in FIG. 1A, the conductive structure 26 and the conductive structures 16 may be disposed differently in other embodiments of the disclosure according to design requirements.

Figure 1B:
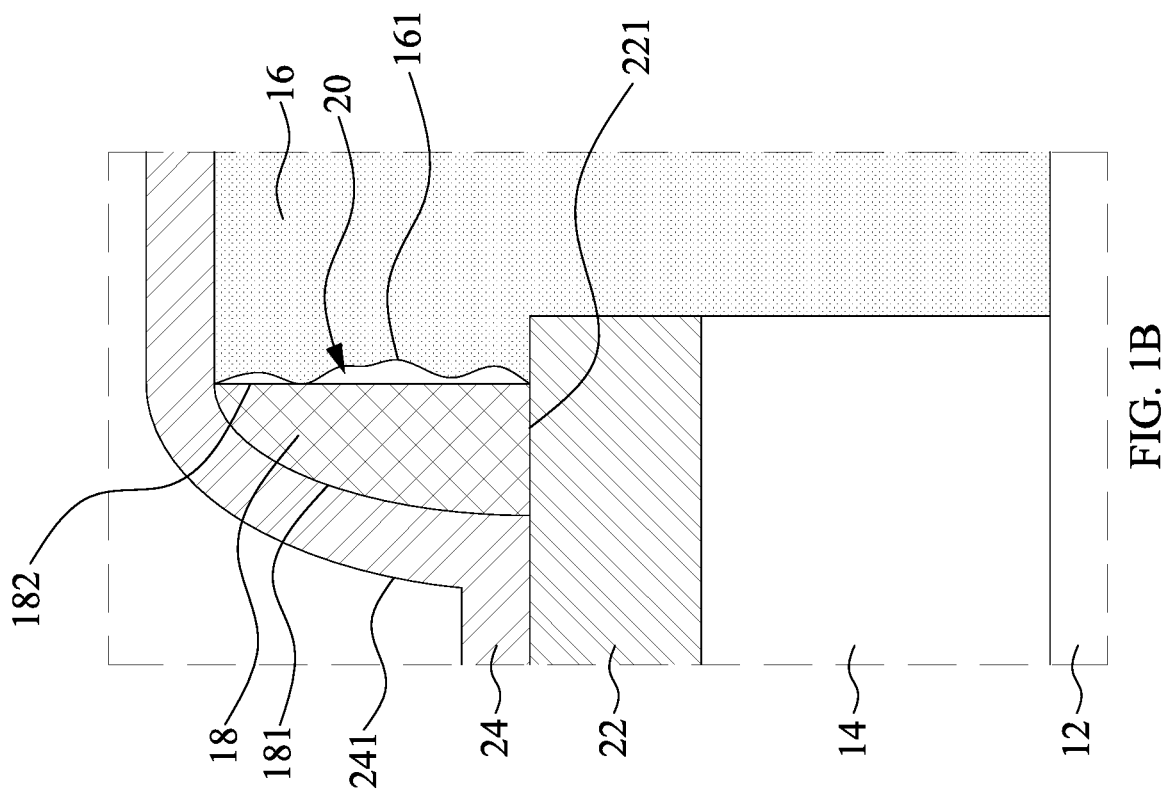
FIG. 1B is an enlarged side view of a semiconductor structure according to some embodiments of the disclosure.

FIG. 1B is an enlarged view of structure in dotted rectangle A as shown in FIG. 1A in accordance with some embodiments of the present disclosure.

As shown in FIG. 1B, the semiconductor layer 14, the conductive structure 16, the spacer 18, the passivation layer 22, and the passivation layer 24 may be included in the dotted rectangle A.

Referring to FIG. 1B, the conductive structure 16 may have a sidewall 161. The sidewall 161 may have a relatively rough surface. The sidewall 161 may be adjacent to the spacer 18. The sidewall 161 may be adjacent to a surface 182 of the spacer 18. The surface 182 can be relatively normal to the passivation 22. In other words, the surface 182 and a surface 221 of the passivation layer 22 can form a substantially right angle. The sidewall 161 may be next to the passivation layer 22. The sidewall 161 may be next to a surface 221 of the passivation layer 22. The sidewall 161 may be next to the passivation layer 24.

The spacer 18 may have a surface 181 and a surface 182. The surface 181 may have a relatively smooth surface. The surface 181 may have a convex surface. The surface 181 may have a convex surface towards the passivation layer 24.

The surface 182 may have a relatively smooth surface. The surface 182 may have a relatively flat surface. The surface 182 may have a relatively even surface. The surface 182 may be adjacent to the conductive structure 16. The surface 182 may be adjacent to the sidewall 161 of the conductive structure 16. The surface 182 may be next to the passivation layer 22. The surface 182 may be next to the surface 221 of the passivation layer 22. The surface 182 may be next to the passivation layer 24.

A void (or space) 20 may be defined by the conductive structure 16 and the spacer 18. The void 20 may also referred to as an empty area. The void 20 may be defined between the sidewall 161 of the conductive structure 16 and the surface 182 of the spacer 18. The void 20 may be defined between the relatively rough sidewall 161 of the conductive structure 16 and the relatively smooth surface 182 of the spacer 18.

The void 20 may be defined by the conductive structure 16, the spacer 18 and the passivation layer 22. The void 20 may be defined among the sidewall 161 of the conductive structure 16, the surface 182 of the spacer 18, and the surface 221 of the passivation layer 22. The void 20 may be defined among the relatively rough sidewall 161 of the conductive structure 16, the relatively smooth surface 182 of the spacer 18 and the relatively smooth surface 221 of the passivation layer 22.

The passivation layer 22 may have a surface 221. The surface 221 may have a relatively smooth surface. The surface 221 may be in direct contact with the conductive structure 16. The surface 221 may be in direct contact with the spacer 18. The surface 221 may be in direct contact with the passivation layer 24. The surface 221, the surface 181, and the sidewall 161 may define the void 20.

The passivation layer 24 may be disposed on the passivation layer 22, the spacer 18, and the conductive structure 16. The passivation layer 24 may have a material different from that of the spacer 18. For example, the passivation layer 24 may have silicon oxide, and the spacer 18 may have silicon nitride. The passivation layer 24 may have a material different from that of the passivation layer 22. The passivation layer 24 may conformally cover the spacer 18. The passivation layer 24 may have a surface 241. The surface 241 may have a relatively smooth surface. The surface 241 may have a convex surface. The surface 241 may have a convex surface due to the application of the spacer 18. The surface 241 may have a convex surface similar to that of the surface 181. The surface 241 may have a convex surface conformal to that of the surface 181.

Figure 1C:
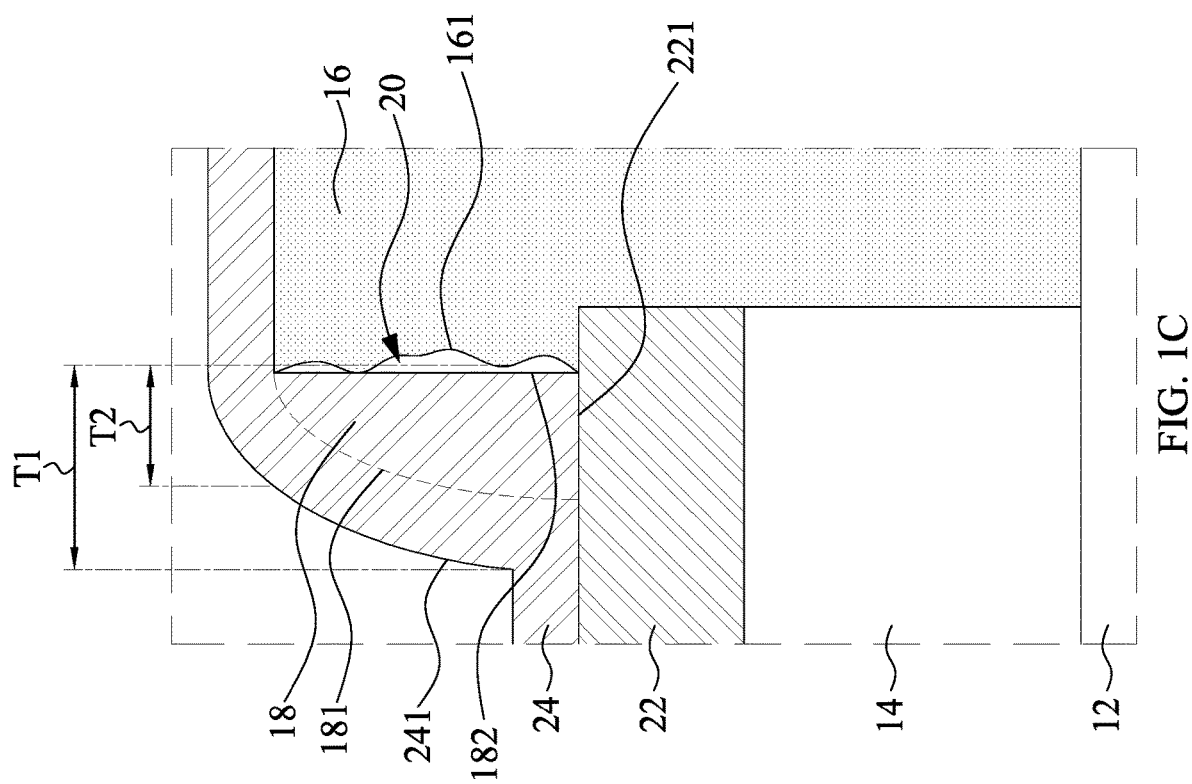
FIG. 1C is an enlarged side view of a semiconductor structure according to some embodiments of the disclosure.

FIG. 1C is an enlarged view of structure in dotted rectangle A as shown in FIG. 1A in accordance with some other embodiments of the present disclosure.

As shown in FIG. 1C, the semiconductor layer 14, the conductive structure 16, the spacer 18, the passivation layer 22, and the passivation layer 24 may be included in the dotted rectangle A. The structure shown in FIG. 1C is similar to the structure shown in FIG. 1B, except that the passivation layer 24 and the spacer 18 in FIG. 1C have the same material. For example, the passivation layer 24 and the spacer 18 may have silicon nitride. The passivation layer 24 and the spacer 18 may be regarded as one single layer when they have the same material. The passivation layer 24 and the spacer 18 may be regarded as one single passivation layer when they have the same dielectric material.

A void 20 may be defined by the conductive structure 16 and the passivation layer 24 along with the spacer 18. Also referring to FIG. 1C, a void 20 may be defined by the conductive structure 16, the passivation layer 24 along with the spacer 18, and the passivation layer 22.

A length T1 may be defined by the conductive structure 16 and the passivation layer 24. The length T1 may be defined by the sidewall 161 of the conductive structure 16 and the surface 241 of the passivation layer 24. A length T2 may be defined by the conductive structure 16 and the passivation layer 24. The length T2 may be defined by the sidewall 161 of the conductive structure 16 and the surface 241 of the passivation layer 24.

The length T1 may be different from the length T2. The length T1 may be shorter than the length T2. The length T1 may be shorter than the length T2 due to the application of the spacer 18. The length T1 may be shorter than the length T2 since the spacer 18 has a convex profile. The length Ti may be shorter than the length T2 since the spacer 18 has a convex profile and the passivation layer 24 conformally covers the spacer 18.

FIG. 1D is an enlarged view of structure in dotted rectangle A as shown in FIG. 1A in accordance with some other embodiments of the present disclosure.

As shown in FIG. 1D, the semiconductor layer 14, the conductive structure 16, the spacer 18, the passivation layer 22, and the passivation layer 24 may be included in the dotted rectangle A. The structure shown in FIG. 1D is similar to the structure shown in FIG. 1B, except that the void between the conductive structure 16 and the spacer 18 is eliminated.

The surface 182 may have a relatively rough surface. The surface 182 may have a relatively irregular surface. The surface 182 may have a relatively uneven surface. The surface 182 may be adjacent to the conductive structure 16. The surface 182 may be adjacent to the sidewall 161 of the conductive structure 16. The surface 182 may be in contact with the sidewall 161 of the conductive structure 16. The surface 182 may be continuously in contact with the sidewall 161 of the conductive structure 16. The surface 182 may be continuously in contact with the sidewall 161 of the conductive structure 16 so that no void may exist therebetween. The surface 182 may substantially overlap with the sidewall 161. The surface 182 may substantially overlap with the sidewall 161 so that no void may exist therebetween. The surface 182 and the sidewall 161 can together form an interface or boundary between the spacer 18 and the conductive structure 16.

FIG. 2A, FIG. 2B, FIG. 2C, FIG. 2D, FIG. 2E, FIG. 2F and FIG. 2G show several operations for manufacturing a semiconductor device according to some embodiments of the disclosure.

Referring to FIG. 2A, a substrate 10 is provided. In some embodiments, the substrate 10 may include a silicon substrate. In some embodiments, the substrate 10 may be an intrinsic silicon substrate. In some embodiments, the substrate 10 may be doped with a dopant. In some embodiments, the substrate 10 may include a p-type semiconductor substrate. In some embodiments, the substrate 10 may be doped with at least one of boron (B) and gallium (Ga) to form a p-type semiconductor substrate. In some embodiments, the substrate 10 may include an n-type semiconductor substrate. In some embodiments, the substrate 10 may be doped with at least one of phosphorus (P) and arsenic (As) to form an n-type semiconductor substrate.

In some embodiments, a semiconductor layer 12 is disposed on the substrate 10. In some embodiments, the semiconductor layer 12 may be formed through chemical vapor deposition (CVD) and/or another suitable deposition step. In some embodiments, the semiconductor layer 12 may be formed on the substrate 10 through CVD and/or another suitable deposition step. In some embodiments, a buffer layer may be disposed between the substrate 10 and the semiconductor layer 12. The buffer layer may be formed through CVD and/or another suitable deposition step.

In some embodiments, a semiconductor layer 14 is disposed on the semiconductor layer 12. In some embodiments, the semiconductor layer 14 may be formed through CVD and/or another suitable deposition step. In some embodiments, the semiconductor layer 14 may be formed on the semiconductor layer 12 through CVD and/or another suitable deposition step. It should be noted that, the semiconductor layer 14 may be formed after forming the semiconductor layer 12. A heterojunction may be formed when the semiconductor layer 14 is disposed on the semiconductor layer 12. A bandgap of the semiconductor layer 14 may be greater than a bandgap of the semiconductor layer 12. Due to the polarization phenomenon of the formed heterojunction between the semiconductor layer 14 and the semiconductor layer 12, 2DEG may be formed in the semiconductor layer 12. Due to the polarization phenomenon of the formed heterojunction between the semiconductor layer 14 and the semiconductor layer 12, 2DEG may be formed in the semiconductor layer 12 and close to an interface between the semiconductor layer 12 and the semiconductor layer 14.

In some embodiments, a passivation layer 22 is disposed on the semiconductor layer 14. In some embodiments, the passivation layer 22 may be formed through a deposition step. In some embodiments, the passivation layer 22 may be formed on the semiconductor layer 14 through CVD and/or another suitable deposition step.

Figure 2B:
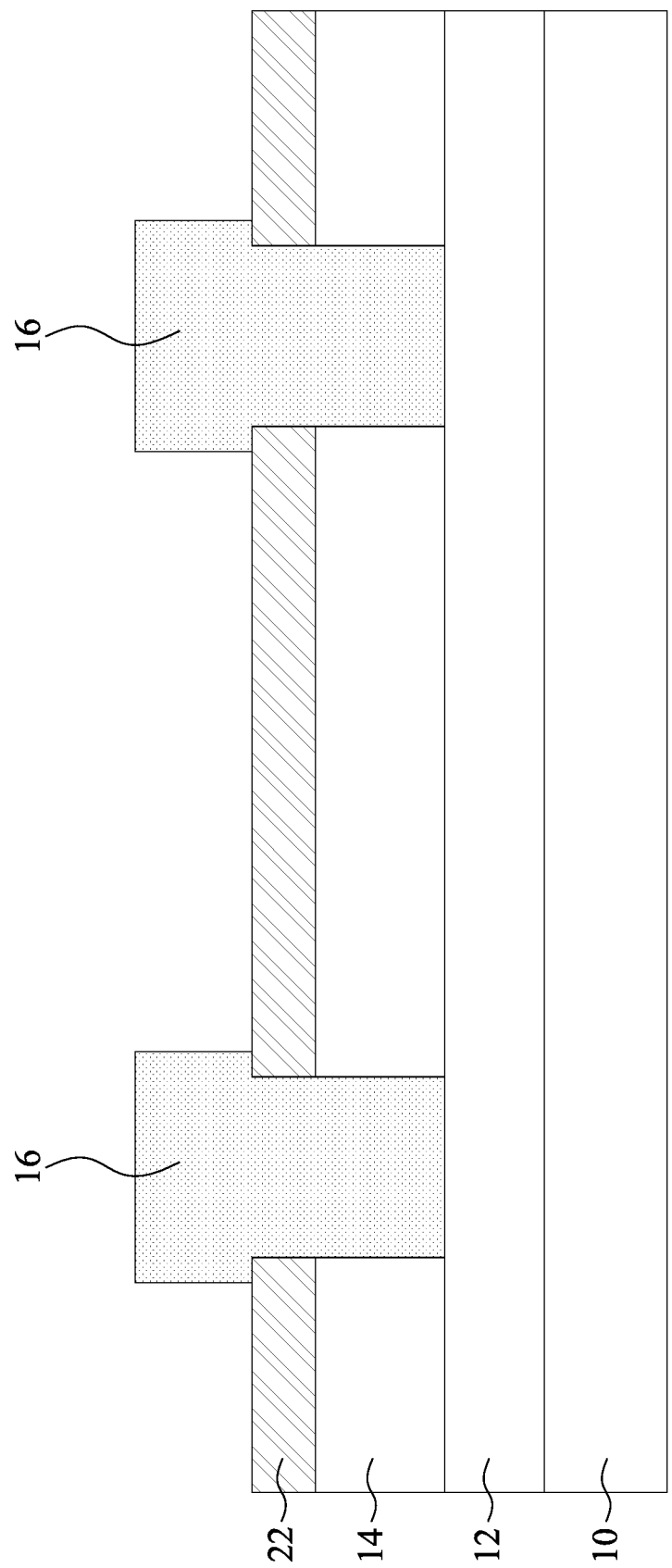

Referring to FIG. 2B, a conductive structure 16 is disposed on the passivation layer 22. The conductive structure 16 may be disposed on the semiconductor layer 12. The conductive structure 16 may be surrounded by the semiconductor layer 14 by etching a portion of the semiconductor layer 14. The conductive structure 16 may be surrounded by the passivation layer 22 by etching a portion of the passivation layer 22. In some embodiments, the conductive structure 16 may be formed through CVD and/or another suitable deposition step. In some embodiments, the conductive structure 16 may be formed on the passivation layer 22 through CVD and/or another suitable deposition step and patterning.

Figure 2C:
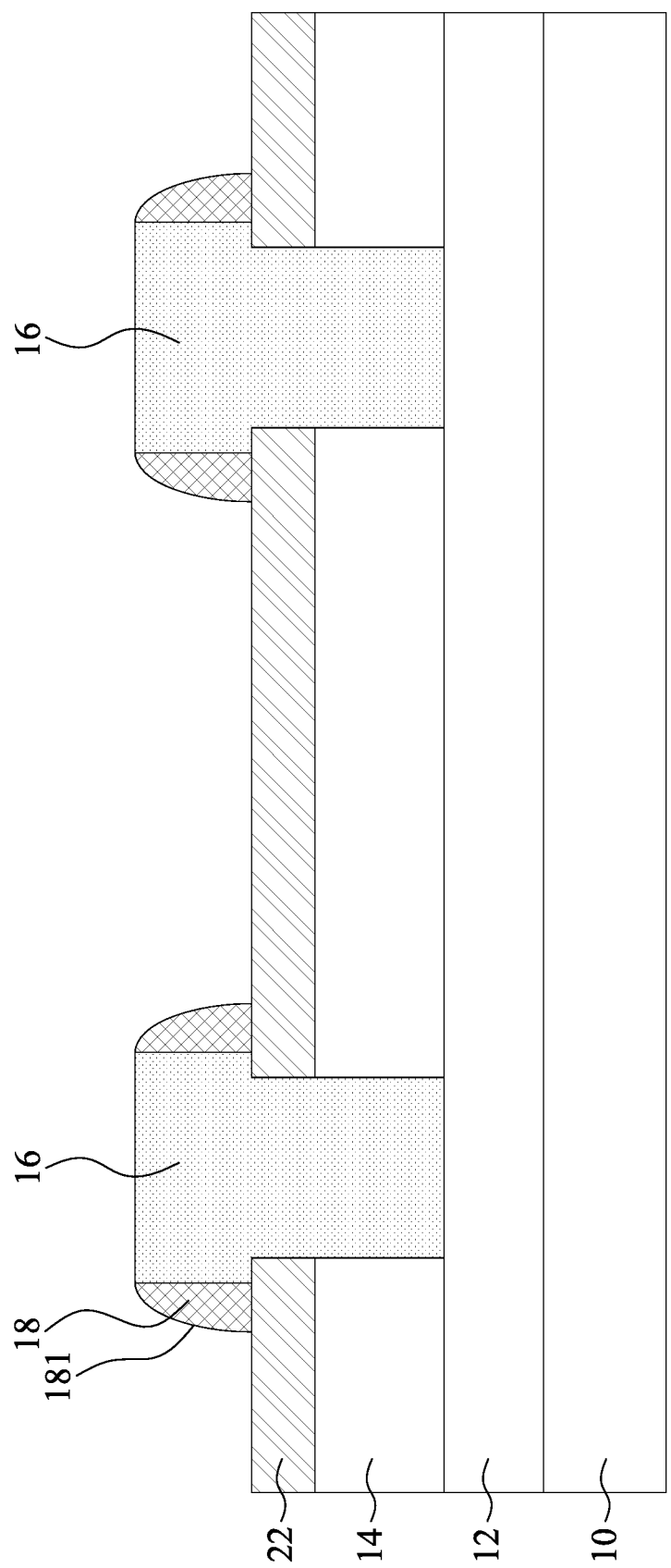

Referring to FIG. 2C, a spacer 18 is formed. In some embodiments, the spacer 18 may be disposed on the passivation layer 22. In some embodiments, the spacer 18 may be disposed adjacent to the conductive structure 16. In some embodiments, the spacer 18 may be formed through CVD and/or another suitable deposition step. In some embodiments, the spacer 18 may be formed on the passivation layer 22 through CVD and/or another suitable deposition step. The spacer 18 may be formed to have a surface 181. The spacer 18 may be patterned to have a surface 181. It should be noted that, the surface 181 may have a convex surface.

Figure 2D:
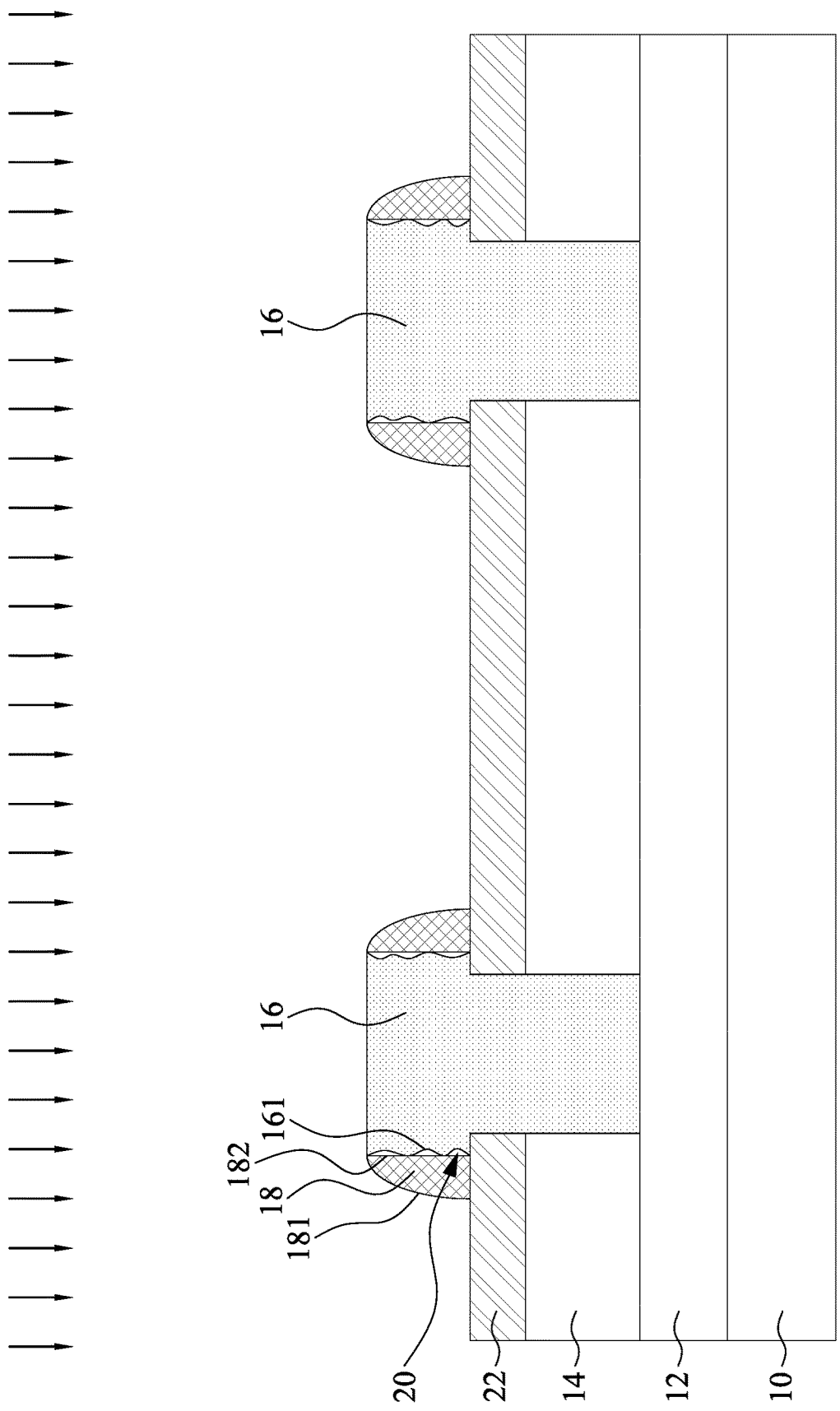

Referring to FIG. 2D, a heat treatment or thermal operation can be performed on the structure as shown in FIG. 2C. The thermal operation can include, for example but is not limited to, an annealing technique (e.g. a rapid thermal anneal (RTA) technique) or other suitable technique(s).

In some embodiments, the thermal operation may be performed at a temperature which can range from approximately 600° C. to approximately 800° C. In some other embodiments, the thermal operation may be performed at a temperature which can range from approximately 650° C. to approximately 750° C. In some other embodiments, the thermal operation can be performed at about 700° C. In some embodiments, the thermal operation may last for a duration ranging from approximately 10 seconds to approximately 50 seconds. In some other embodiments, the thermal operation may last for a duration ranging from approximately 20 seconds and 40 seconds. In some other embodiments, the thermal operation may be performed for around 30 seconds.

Also referring to FIG. 2D, the profile of the conductive structure 16 is changed. In some embodiments, the profile of the conductive structure 16 may be changed due to the annealing operation. The conductive structure 16 may have a relatively rough sidewall 161 due to the annealing operation. The spacer 18 may not be affected by the annealing operation. The spacer 18 may have a relatively smooth surface 181 even if the annealing operation is performed. The spacer 18 may have a relatively smooth surface 182 even if the annealing operation is performed. The profile of the spacer 18 may not be affected by the annealing operation. It should be noted that, the surface 181 of the spacer 18 may be convex even if the annealing operation is performed.

Also referring to FIG. 2D, a void 20 is formed. The void 20 may be formed due to the annealing operation. The void 20 may be defined by the spacer 18 and the conductive structure 16. The void 20 may be defined by the surface 182 of the spacer 18 and the sidewall 161 of the conductive structure 16. The void 20 may be encircled by the surface 182 of the spacer 18 and the sidewall 161 of the conductive structure 16. The void 20 may be encircled by the relatively smooth surface 182 of the spacer 18 and the relatively rough sidewall 161 of the conductive structure 16. The void 20 may be enclosed by the surface 182 of the spacer 18 and the sidewall 161 of the conductive structure 16. The void 20 may be enclosed by the relatively smooth surface 182 of the spacer 18 and the relatively rough sidewall 161 of the conductive structure 16. The void 20 may be surrounded by the surface 182 of the spacer 18 and the sidewall 161 of the conductive structure 16. The void 20 may be surrounded by the relatively smooth surface 182 of the spacer 18 and the relatively rough sidewall 161 of the conductive structure 16. In some embodiments, the void 20 may be defined by the passivation layer 22, the spacer 18 and the conductive structure 16. The void 20 may be defined by the passivation layer 22, the surface 182 of the spacer 18 and the sidewall 161 of the conductive structure 16. The void 20 may be encircled by the passivation layer 22, the surface 182 of the spacer 18 and the sidewall 161 of the conductive structure 16. The void 20 may be encircled by the passivation layer 22, the relatively smooth surface 182 of the spacer 18 and the relatively rough sidewall 161 of the conductive structure 16. The void 20 may be enclosed by the passivation layer 22, the surface 182 of the spacer 18 and the sidewall 161 of the conductive structure 16. The void 20 may be enclosed by the passivation layer 22, the relatively smooth surface 182 of the spacer 18 and the relatively rough sidewall 161 of the conductive structure 16. The void 20 may be surrounded by the passivation layer 22, the surface 182 of the spacer 18 and the sidewall 161 of the conductive structure 16. The void 20 may be surrounded by the passivation layer 22, the relatively smooth surface 182 of the spacer 18 and the relatively rough sidewall 161 of the conductive structure 16.

Figure 2E:
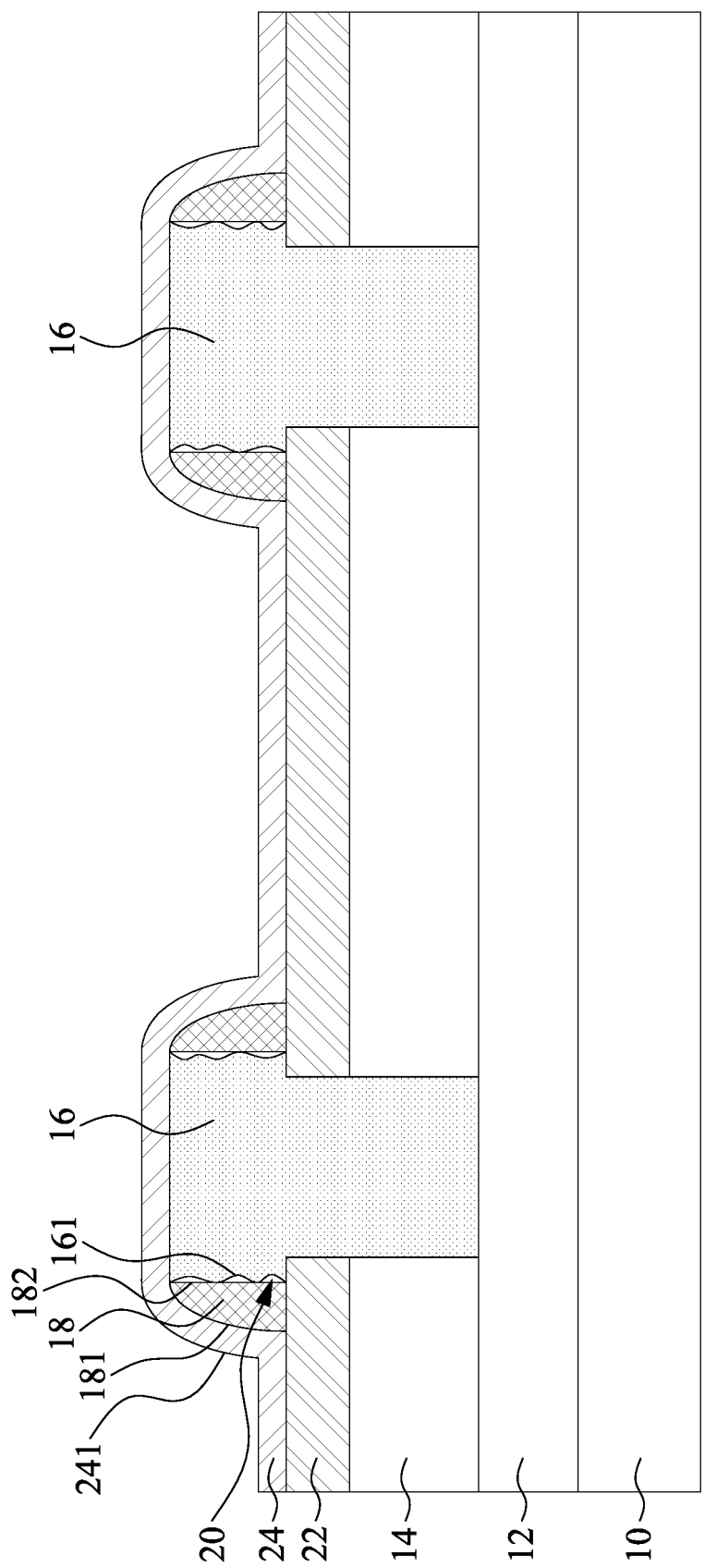

Referring to FIG. 2E, a passivation layer 24 is formed. The passivation layer 24 may be formed through CVD and/or another suitable deposition step. The passivation layer 24 may be disposed on the passivation layer 22. The passivation layer 24 may be disposed on the spacer 18. The passivation layer 24 may be disposed on the conductive structure 16. The passivation layer 24 may conformally cover the passivation layer 22. The passivation layer 24 may conformally cover the spacer 18. The passivation layer 24 may conformally cover the conductive structure 16. The passivation layer 24 may be formed to have a surface 241. The surface 241 may have a relatively smooth surface. The surface 241 may have a convex surface. The surface 241 may have a convex surface similar to the surface 181.

Figure 2F:
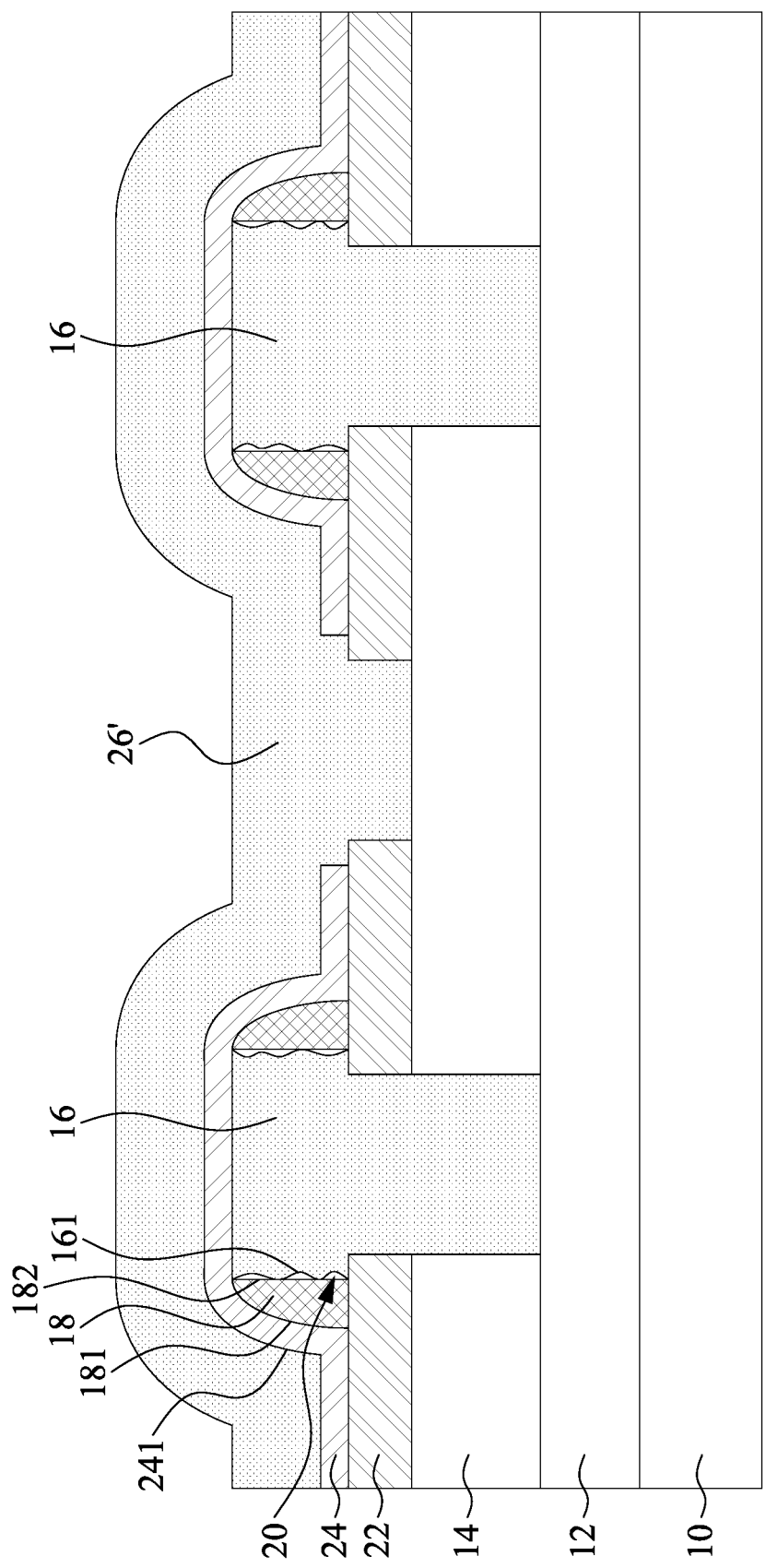

Referring to FIG. 2F, a conductive layer 26' is formed. The conductive layer 26' may be disposed on the passivation layer 24. The conductive layer 26' may be disposed on the semiconductor layer 14. The conductive layer 26' may be surrounded by the passivation layer 22 by etching a portion of the passivation layer 22. In some embodiments, the conductive layer 26' may be formed through CVD and/or another suitable deposition step. In some embodiments, the conductive layer 26' may be formed on the passivation layer 24 through CVD and/or another suitable deposition step.

Figure 2G:
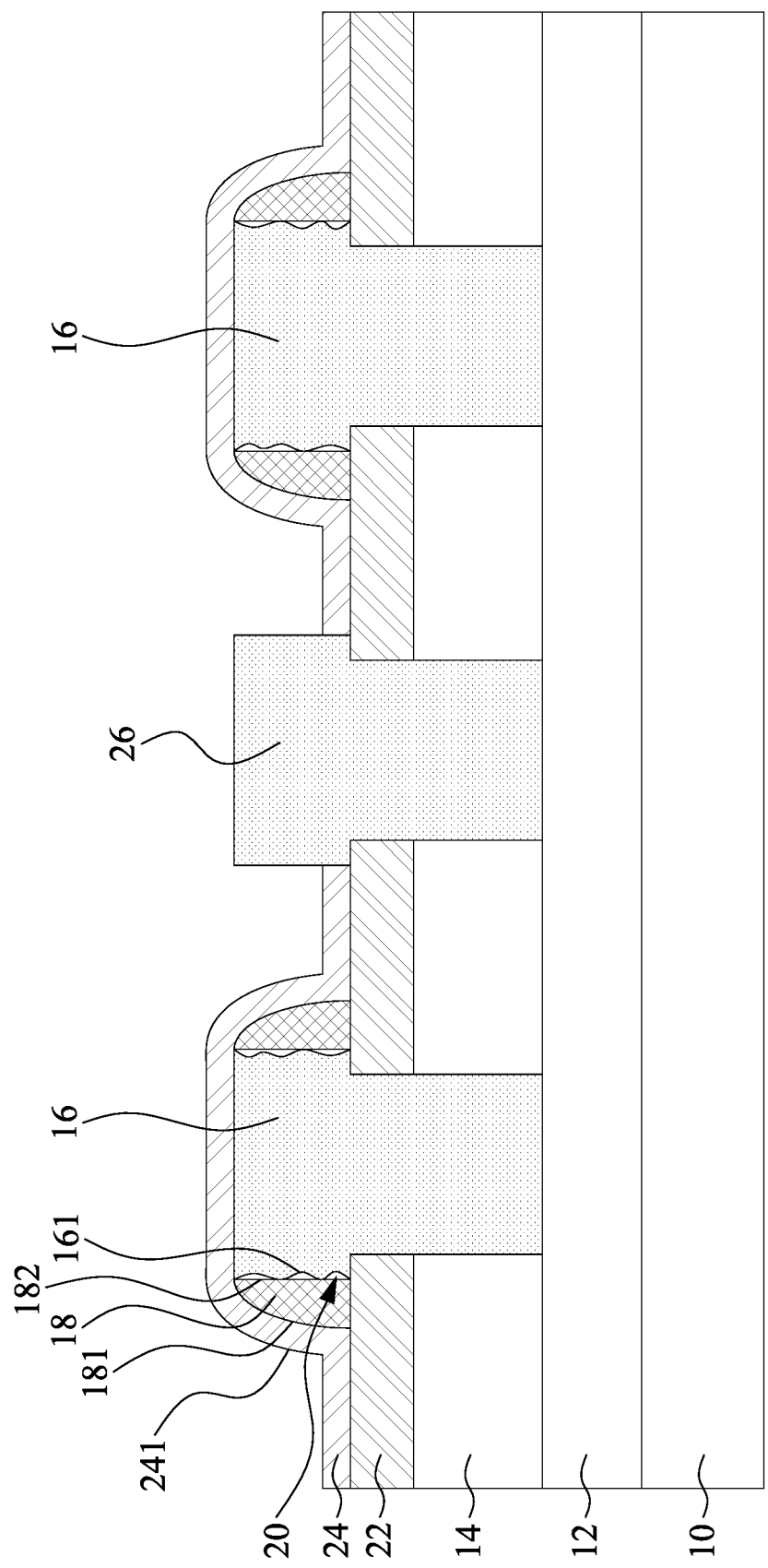

Referring to FIG. 2G, a conductive structure 26 is formed. The conductive structure 26 may be patterned. The conductive structure 26 may be patterned by etching a portion of the conductive layer 26' shown in FIG. 2F. It should be noted that, when forming the conductive structure 26, no residue may be left on the surface 241. When forming the conductive structure 26, no residue may be left on the convex surface 241. No residue from the conductive layer 26' shown in FIG. 2F may be left on the surface 241. It should be noted that, when forming the conductive structure 26, no residue may be attached to the surface 241. When forming the conductive structure 26, no residue may be attached to the convex surface 241. No residue from the conductive layer 26' shown in FIG. 2F may be attached to the surface 241. The surface 241 may be clean after patterning the conductive structure 26.

As the semiconductor device is scaled down, defects, such as a residue which cannot completely removed during manufacturing, may influence the electrical performance of the semiconductor device. This kind of defect should be prevented. Since the spacer 18 can resist the temperature of an annealing process during manufacturing, the profile of the spacer 18 may not be changed. Since the profile of the spacer 18 is not affected by the annealing process, the following processes, such as passivation layer formation, may be performed so that the passivation layer 24 may conformally cover the spacer 18, and both the passivation layer 24 and the spacer 18 may not cave in the sidewalls of the conductive structure 16. Since the profile of the spacer 18 is not affected by the annealing process, the following processes, such as gate conductor formation and field plate formation, may be performed without leaving residue adjacent to the sidewalls of the conductive structure 16. In other words, when etching excess materials to form the conductive structure 26, no residue would be left on the passivation layer 24 since the passivation layer 24 has concave surfaces near the sidewalls of the conductive structure 16.

FIG. 3A, FIG. 3B, FIG. 3C, FIG. 3D, FIG. 3E, and FIG. 3F show several operations for manufacturing a semiconductor device according to some other embodiments of the disclosure.

Figure 3A:
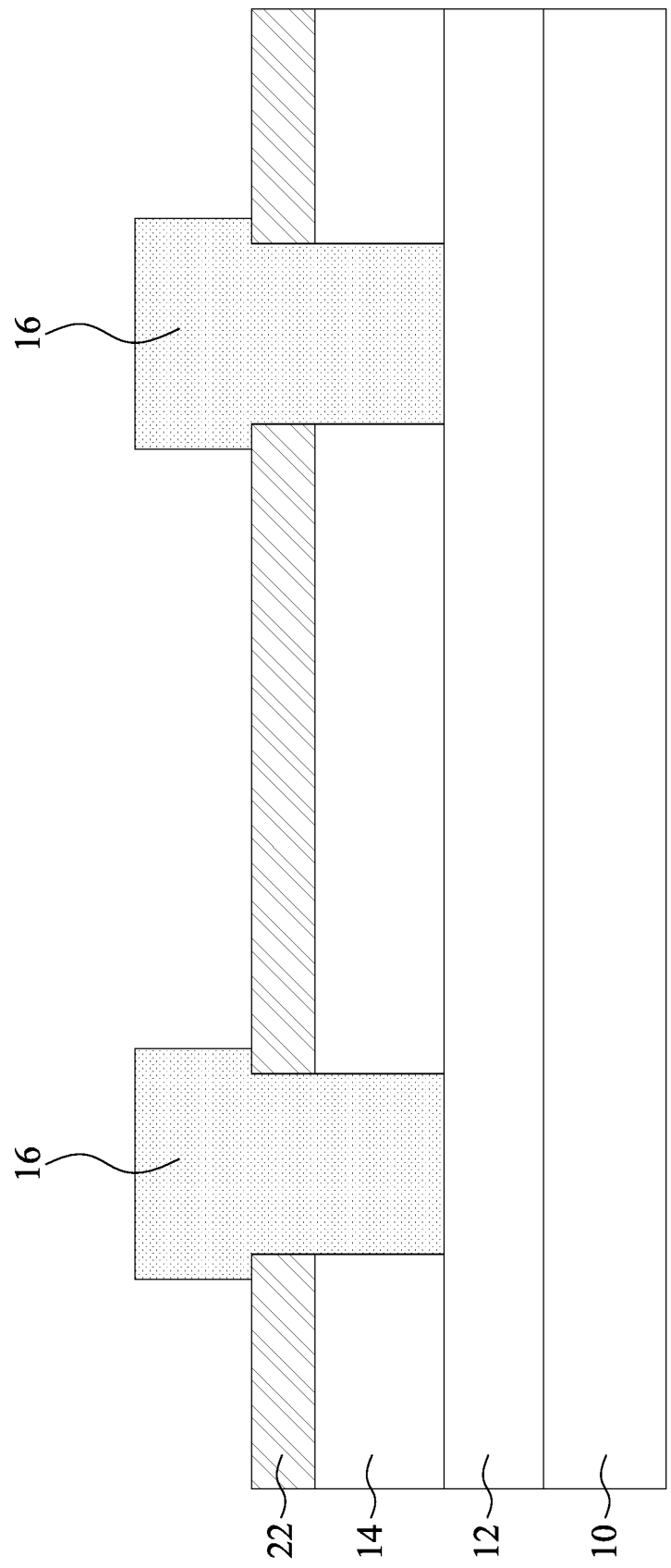
FIG. 3A, FIG. 3B, FIG. 3C, FIG. 3D, FIG. 3E, and FIG. 3F show several operations for manufacturing a semiconductor device according to some embodiments of the disclosure.

Referring to FIG. 3A, a structure (not denoted in FIG. 3A), which includes a substrate 10, a semiconductor layer 12, a semiconductor layer 14, a passivation layer 22 and a conductive structure 16, is provided. The structure can be identical or similar to the structure as illustrated and described with reference to FIG. 2B, and can be fabricated by the operations as illustrated and described with reference to FIG. 2A and FIG. 2B.

Figure 3B:
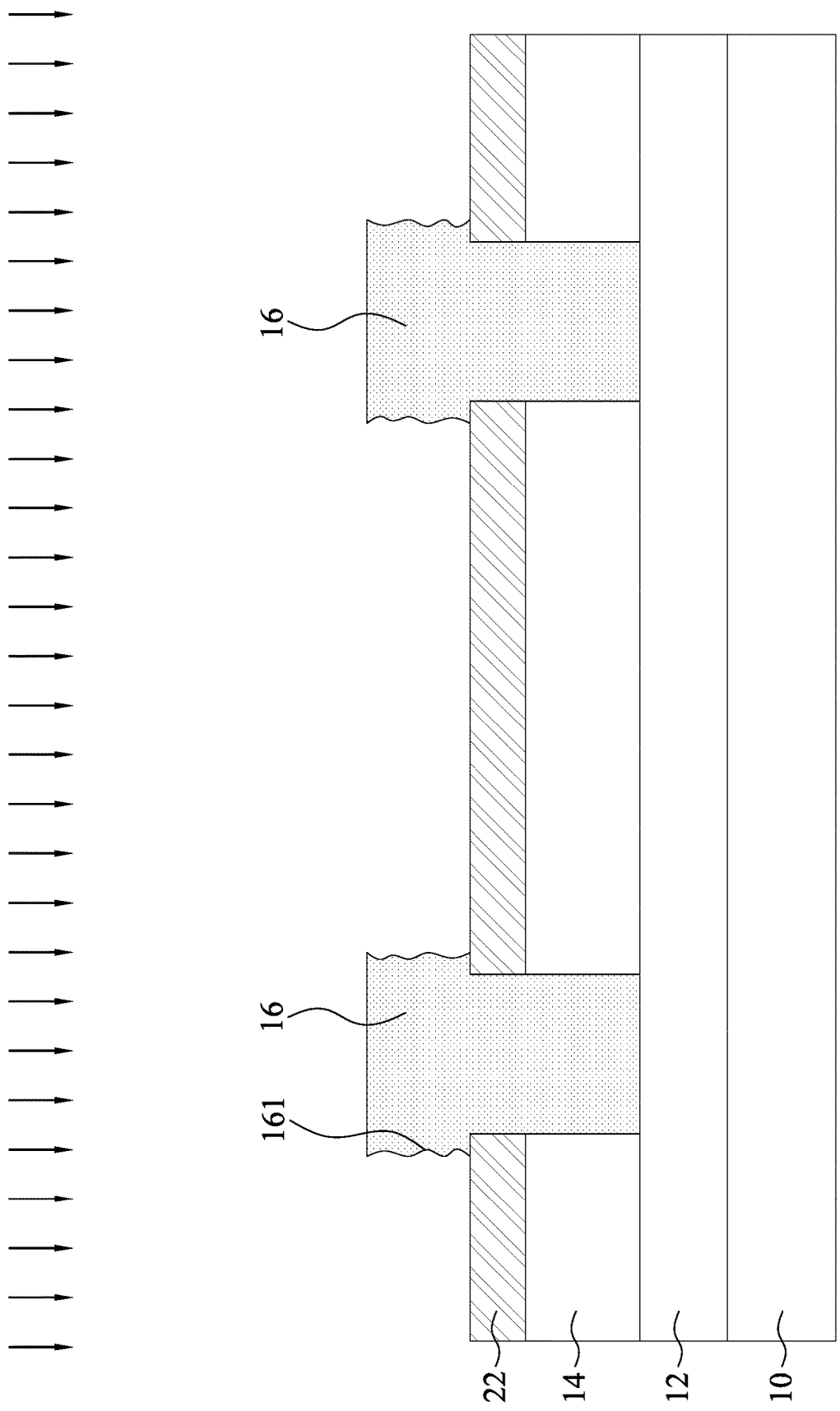

Referring to FIG. 3B, a heat treatment or thermal operation can be performed on the structure as shown in FIG. 3A. The thermal operation can include, for example but is not limited to, an annealing technique (e.g. an RTA technique) or other suitable technique(s).

In some embodiments, the thermal operation may be performed at a temperature which can range from approximately 600° C. to approximately 800° C. In some other embodiments, the thermal operation may be performed at a temperature which can range from approximately 650° C. to approximately 750° C. In some other embodiments, the thermal operation can be performed at about 700° C. In some embodiments, the thermal operation may last for a duration ranging from approximately 10 seconds to approximately 50 seconds. In some other embodiments, the thermal operation may last for a duration ranging from approximately 20 seconds and 40 seconds. In some other embodiments, the thermal operation may be performed for around 30 seconds.

The thermal operation or heat treatment may change the conductive structure 16. As shown in FIG. 3B, the profile of the conductive structure 16 is changed by the thermal operation. Subsequent to the thermal operation, the sidewall of the conductive structure 16 may shrink to form an uneven surface 161. The conductive structure 16 may have a relatively rough sidewall 161 due to the thermal operation.

Figure 3C:
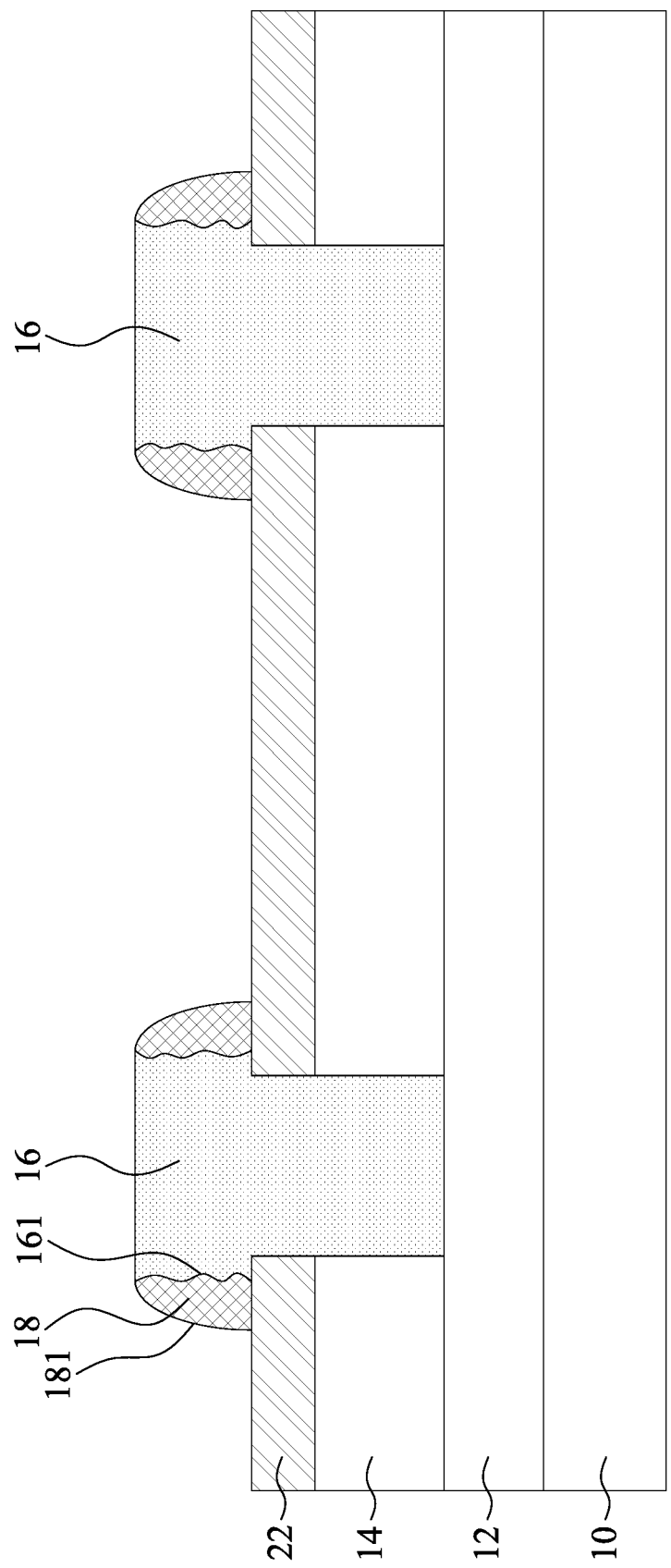

Referring to FIG. 3C, a spacer 18 is formed. The spacer 18 may be disposed on the passivation layer 22. The spacer 18 may be disposed adjacent to the conductive structure 16.

The spacer 18 may be formed by, for example but is not limited to, CVD or other suitable technique(s). The spacer 18 may be formed to have a surface 181. The spacer 18 may be patterned to have a curve surface 181. The surface 181 may have a convex surface.

The spacer 18 may be in contact with the sidewall 161 of the conductive structure 16. The spacer 18 may be substantially in contact with the sidewall 161 of the conductive structure 16. The spacer 18 may be directly in contact with the sidewall 161 of the conductive structure 16. The spacer 18 may be continuously in contact with the sidewall 161 of the conductive structure 16. The spacer 18 may engage with the sidewall 161 of the conductive structure 16. The spacer 18 and the sidewall 161 of the conductive structure 16 can be tightly engaged. The spacer 18 can be formed to tightly fit in the uneven sidewall 161 of the conductive structure 16. The spacer 18 can be formed to match the uneven sidewall 161 of the conductive structure 16.

Figure 3D:
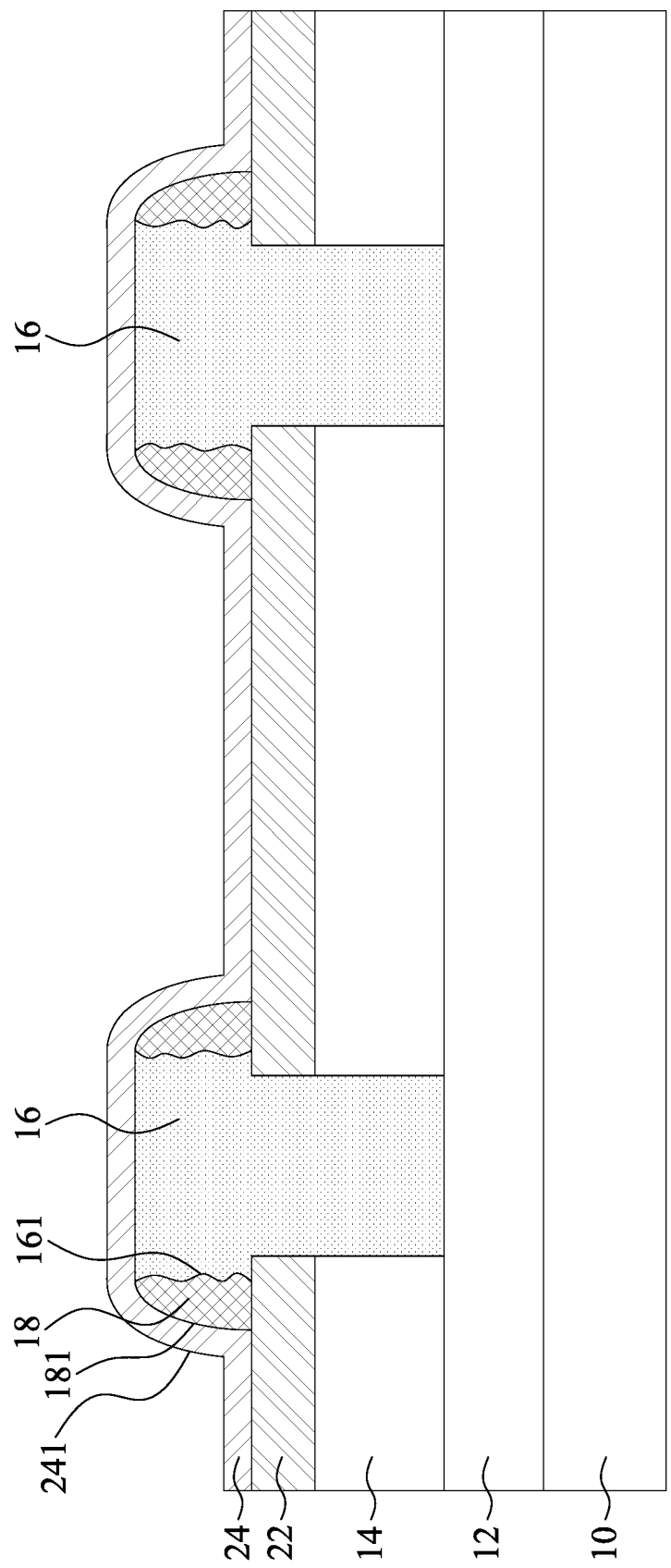
Figure 3E:
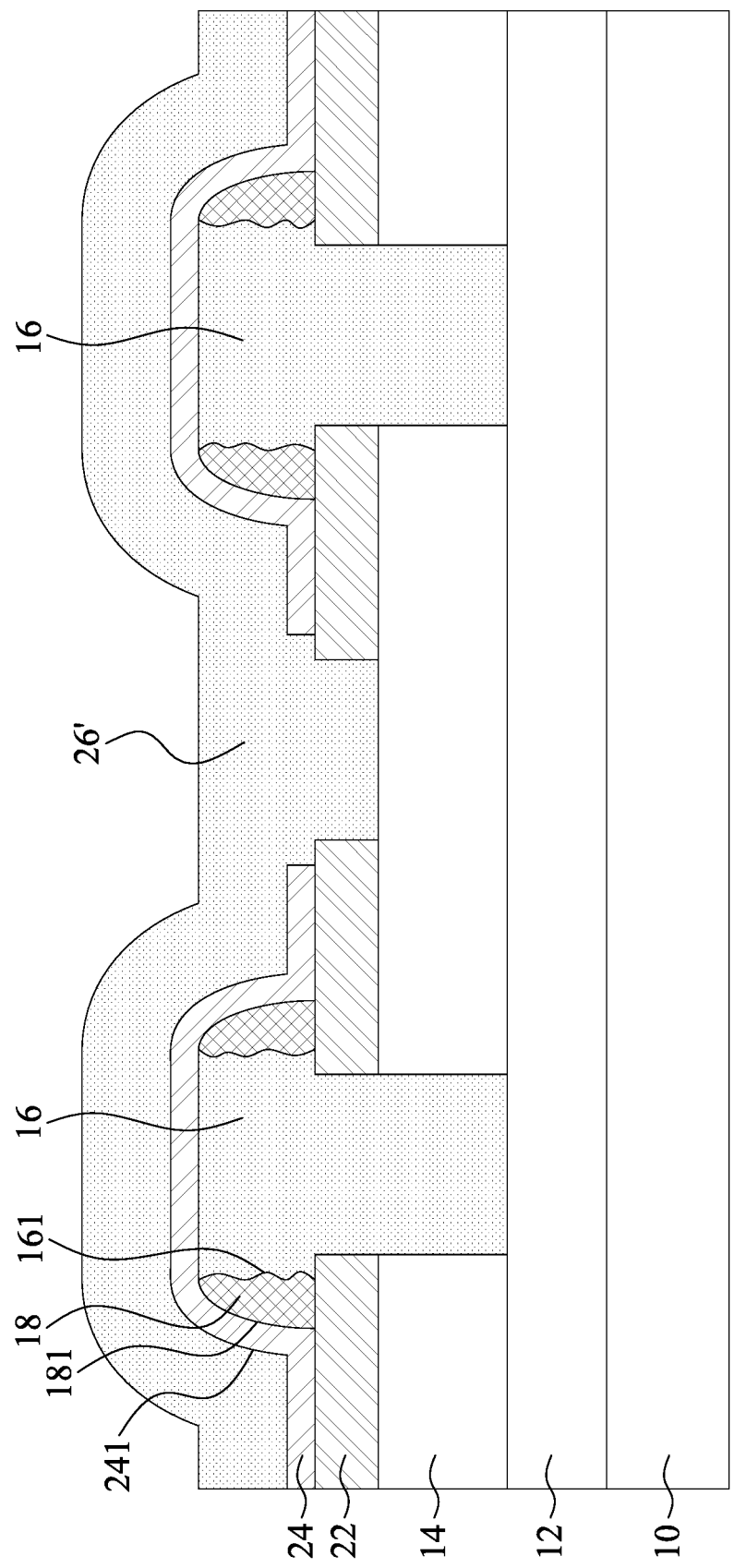
Figure 3F:
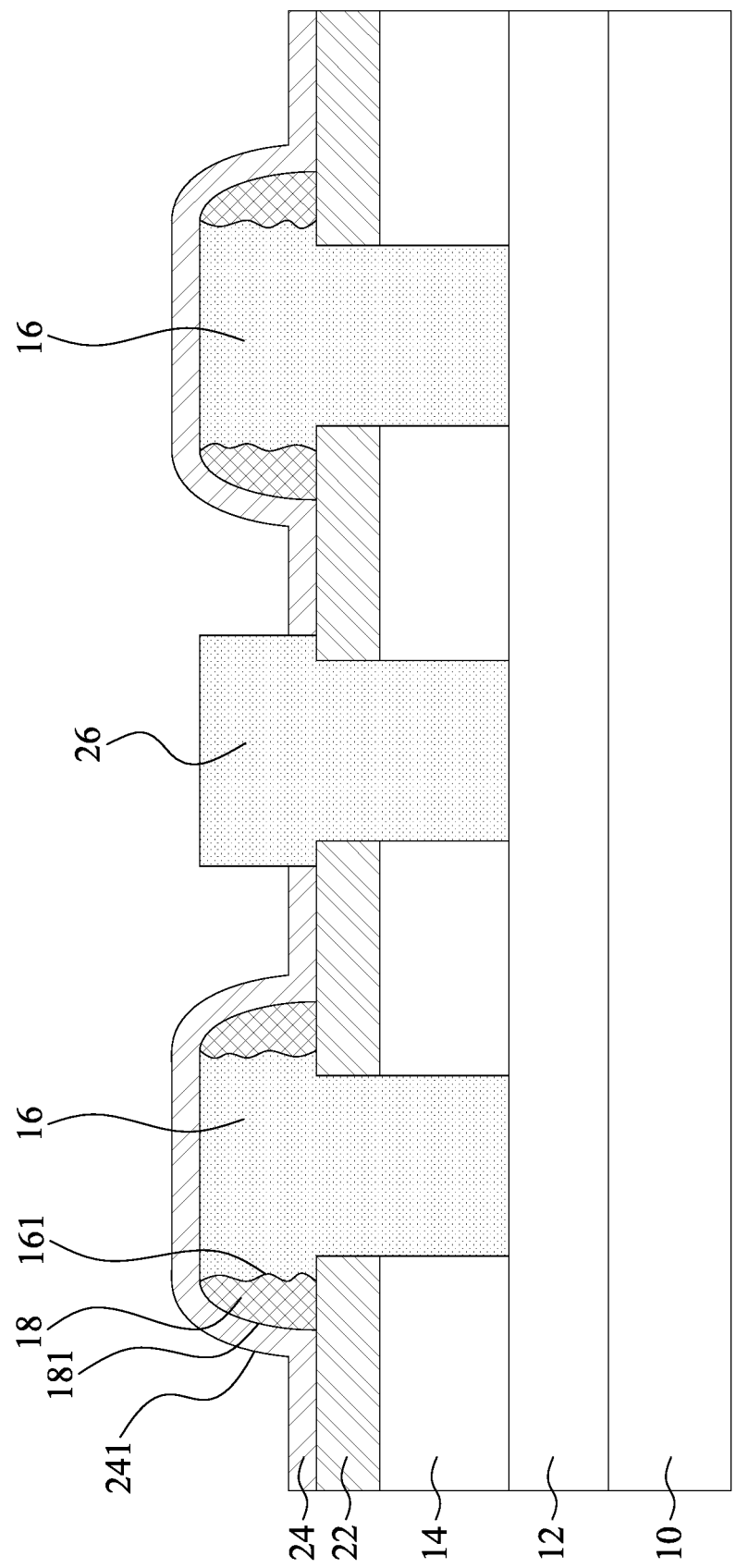

The operations performed in FIG. 3D, FIG. 3E and FIG. 3F can be identical or similar to the operations as illustrated and described with reference to FIG. 2E, FIG. 2F and FIG. 2G.

It should be noted that, when forming the conductive structure 26, no residue may be left on the surface 241. When forming the conductive structure 26, no residue may be left on the convex surface 241. No residue from the conductive layer 26' shown in FIG. 3E may be left on the surface 241. It should be noted that, when forming the conductive structure 26, no residue may be attached to the surface 241. When forming the conductive structure 26, no residue may be attached to the convex surface 241. No residue from the conductive layer 26' shown in FIG. 3E may be attached to the surface 241. The surface 241 may be clean after patterning the conductive structure 26.

Figure 4A:
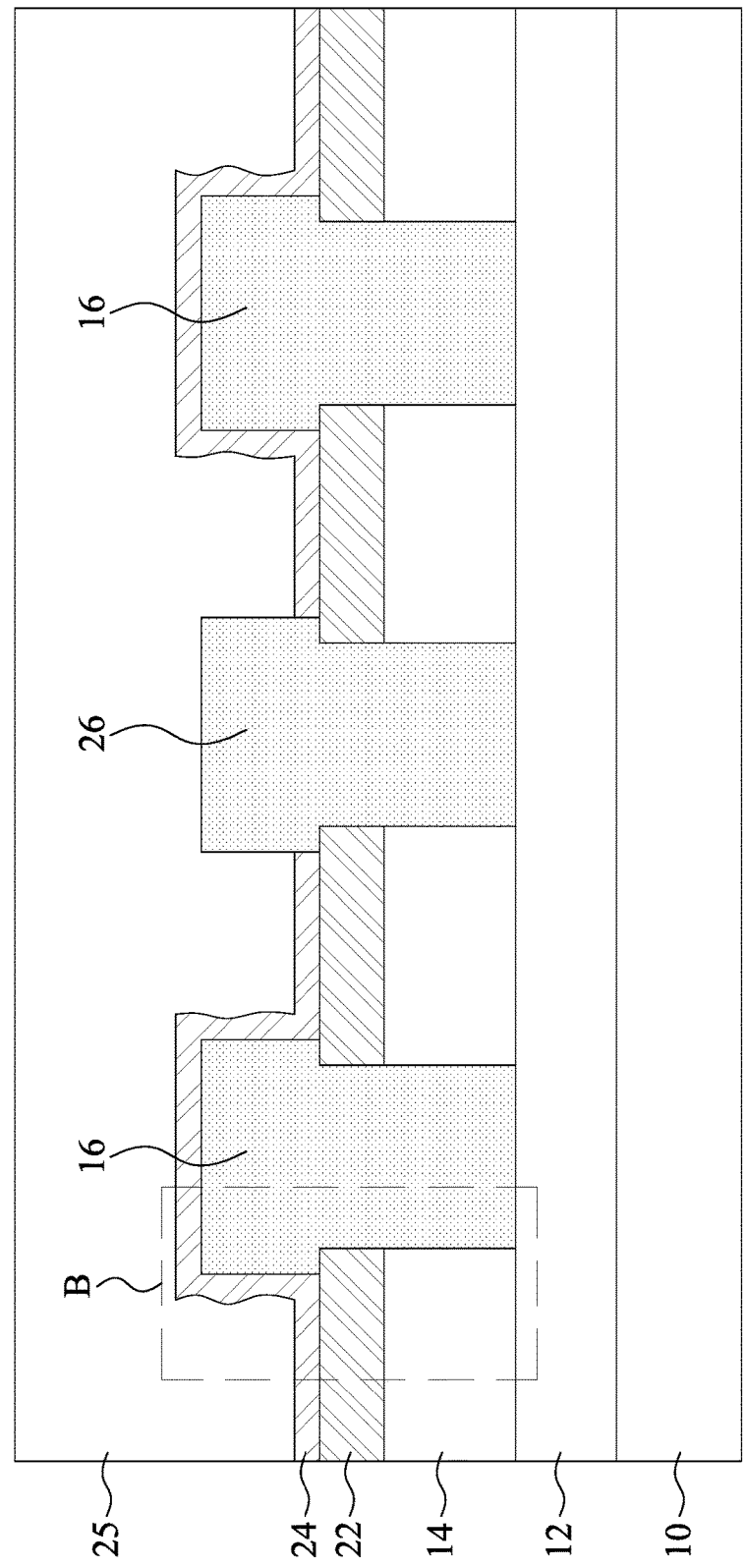
FIG. 4A is a side view of a semiconductor device according to some embodiments of the disclosure.

FIG. 4A is a side view of a semiconductor device 2 according to some embodiments of the disclosure.

As shown in FIG. 4A, the semiconductor device 2 is similar to the semiconductor device 1 shown in FIG. 1A, but differs in that the semiconductor device 2 shown in FIG. 4A does not include any spacer. The semiconductor device 2 may not have any spacer adjacent to the conductive structure 16. The detailed structure in dotted rectangle B in FIG. 4A according to some embodiments of the disclosure is illustrated in FIG. 4B.

FIG. 4B is an enlarged view of structure in dotted rectangle B as shown in FIG. 4A in accordance with some embodiments of the present disclosure.

As shown in FIG. 4B, the passivation layer 24 may be disposed on the passivation layer 22. The passivation layer 24 may be disposed on the conductive structure 16. The passivation layer 24 may cover the conductive structure 16. The passivation layer 24 may have a surface 242. The surface 242 may have a relatively rough surface. The surface 242 may have an uneven surface. The surface 242 may have an uneven surface since the sidewall 161 of the conductive structure 16 has a relatively rough surface. The surface 242 may have an uneven surface. The surface 242 may have an uneven surface since the sidewall 161 of the conductive structure 16 has a relatively rough surface and the passivation layer 24 conformally covers the sidewall 161 of the conductive structure 16.

Referring to FIG. 4B, a residue 28 is disposed on the surface 242. The residue 28 may be left on the surface 242. The residue 28 may be attached to the surface 242. The residue 28 may have a material identical to that of the conductive structure 26 shown in FIG. 4A. The residue 28 may be originated from the conductive structure 26 shown in FIG. 4A. It should be noted that, the residue 28 may influence the electrical property. The residue 28 may influence the electrical property when the semiconductor device 2 is scaled down.

FIG. 5A, FIG. 5B, FIG. 5C, FIG. 5D, FIG. 5E, and FIG. 5F show several operations for manufacturing a semiconductor device according to some embodiments of the disclosure. FIG. 5A, FIG. 5B, FIG. 5C, FIG. 5D, FIG. 5E, and FIG. 5F depict several operations for manufacturing the semiconductor device 2 shown in FIG. 4A.

Figure 5A:
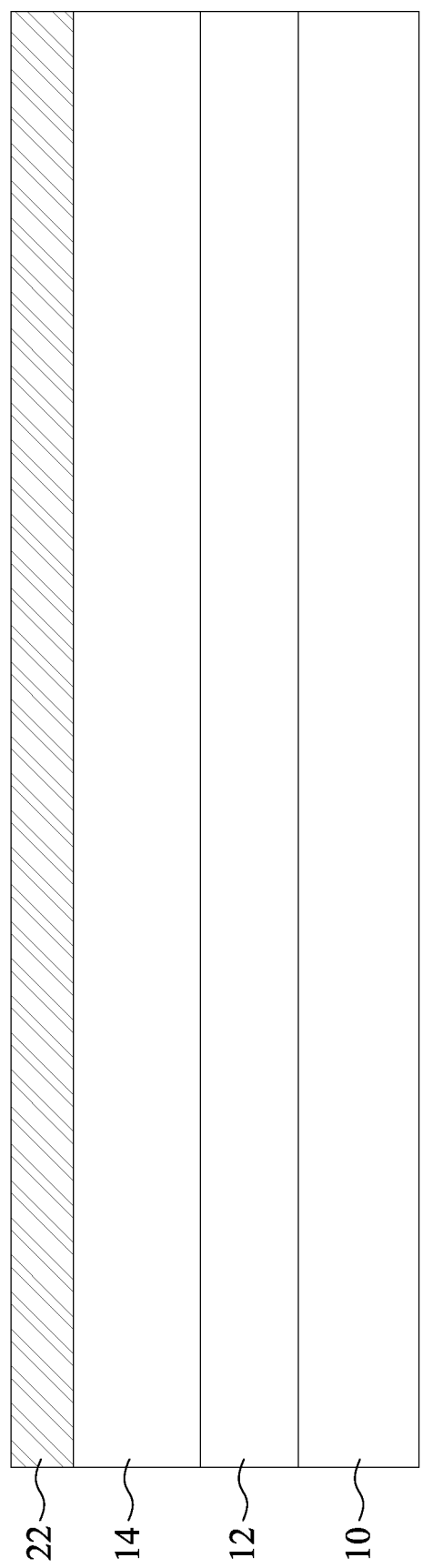
FIG. 5A, FIG. 5B, FIG. 5C, FIG. 5D, FIG. 5E, and FIG. 5F show several operations for manufacturing a semiconductor device according to some embodiments of the disclosure.

Referring to FIG. 5A, a substrate 10, a semiconductor layer 12, a semiconductor layer 14 and a passivation layer 22 are provided. The foregoing illustration for the operations with regard to FIG. 2A may be applicable to FIG. 5A.

Figure 5B:
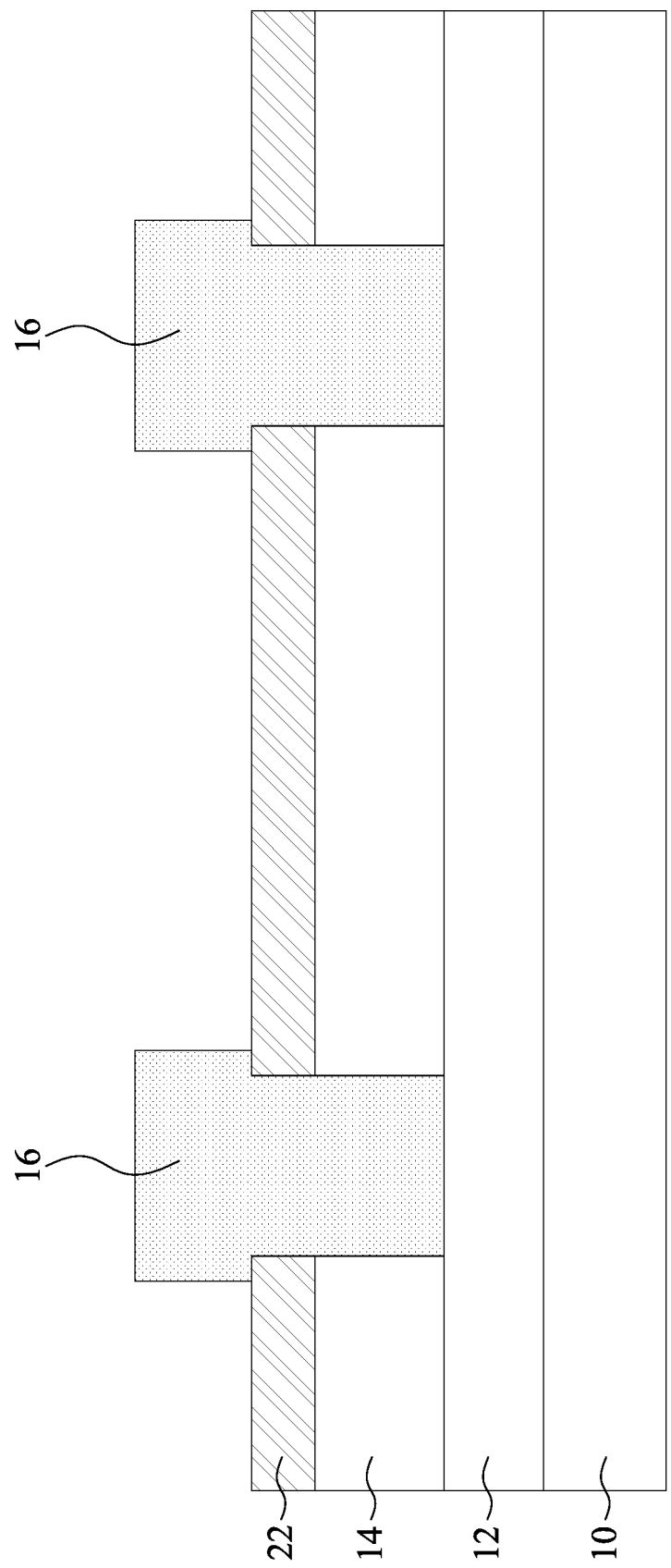

Referring to FIG. 5B, a conductive structure 16 is disposed on the passivation layer 22. The foregoing illustration for the operations with regard to FIG. 2B may be applicable to FIG. 5B.

Figure 5C:
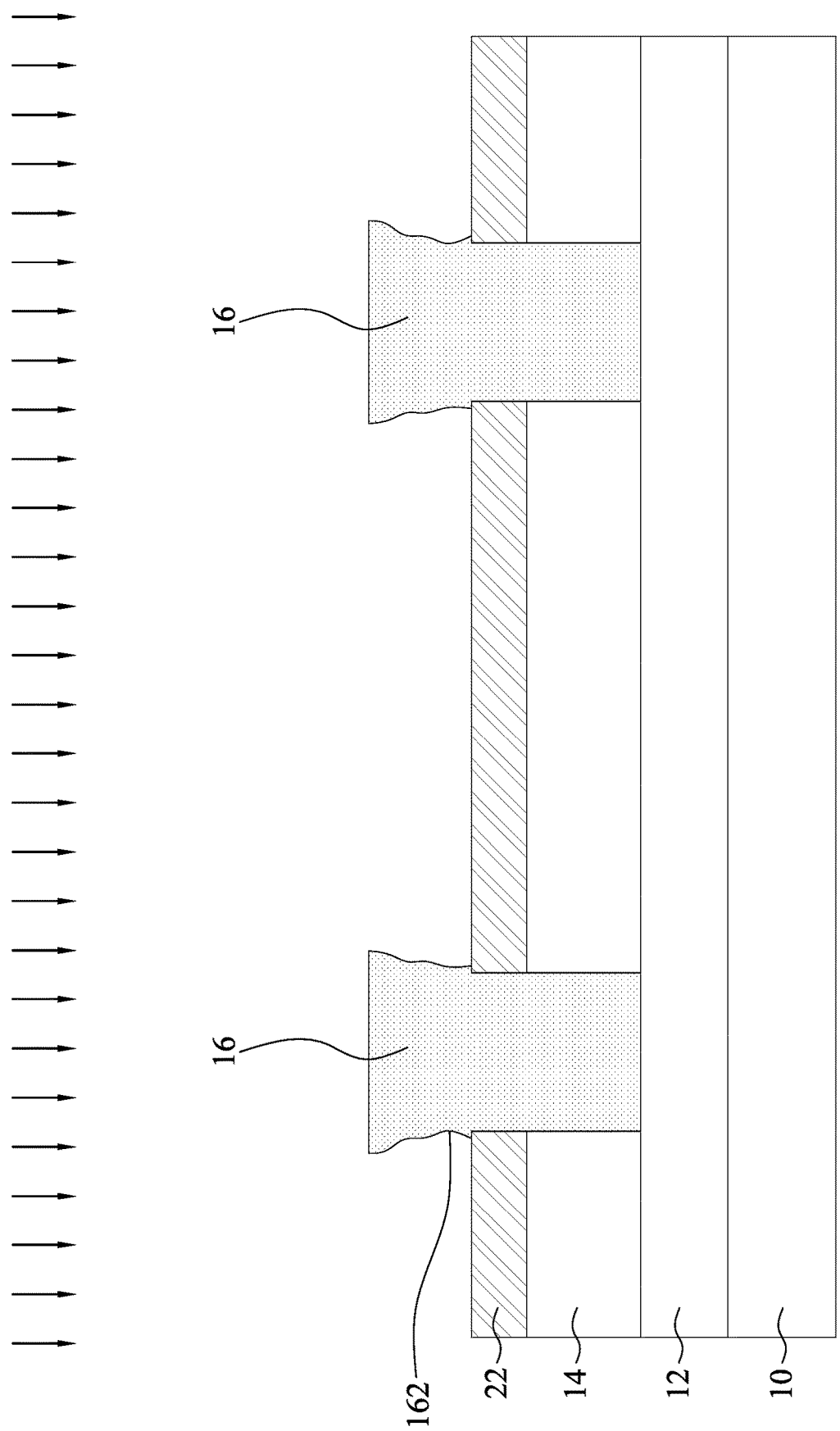

Referring to FIG. 5C, a heat treatment is performed. In some embodiments, a thermal operation may be performed. In some embodiments, an annealing operation may be performed. In some embodiments, an RTA may be performed. In some embodiments, the annealing operation may be performed at the temperature between approximately 600° C. and 800° C. In some embodiments, the annealing operation may be performed at the temperature between approximately 650° C. and 750° C. In some embodiments, the annealing operation may be performed at the temperature about 700° C. In some embodiments, the annealing operation may be performed for the duration between approximately 10 seconds and 50 seconds. In some embodiments, the annealing operation may be performed for the duration between approximately 20 seconds and 40 seconds. In some embodiments, the annealing operation may be performed for the duration of around 30 seconds.

Also referring to FIG. 5C, the conductive structure 16 may be affected by the annealing operation. The profile of the conductive structure 16 is changed. In some embodiments, the profile of the conductive structure 16 may be changed due to the annealing operation. The conductive structure 16 may have a relatively rough sidewall 162 due to the annealing operation. It should be noted that, the sidewall 162 of the conductive structure 16 may have an uneven surface after the annealing operation is performed.

Figure 5D:
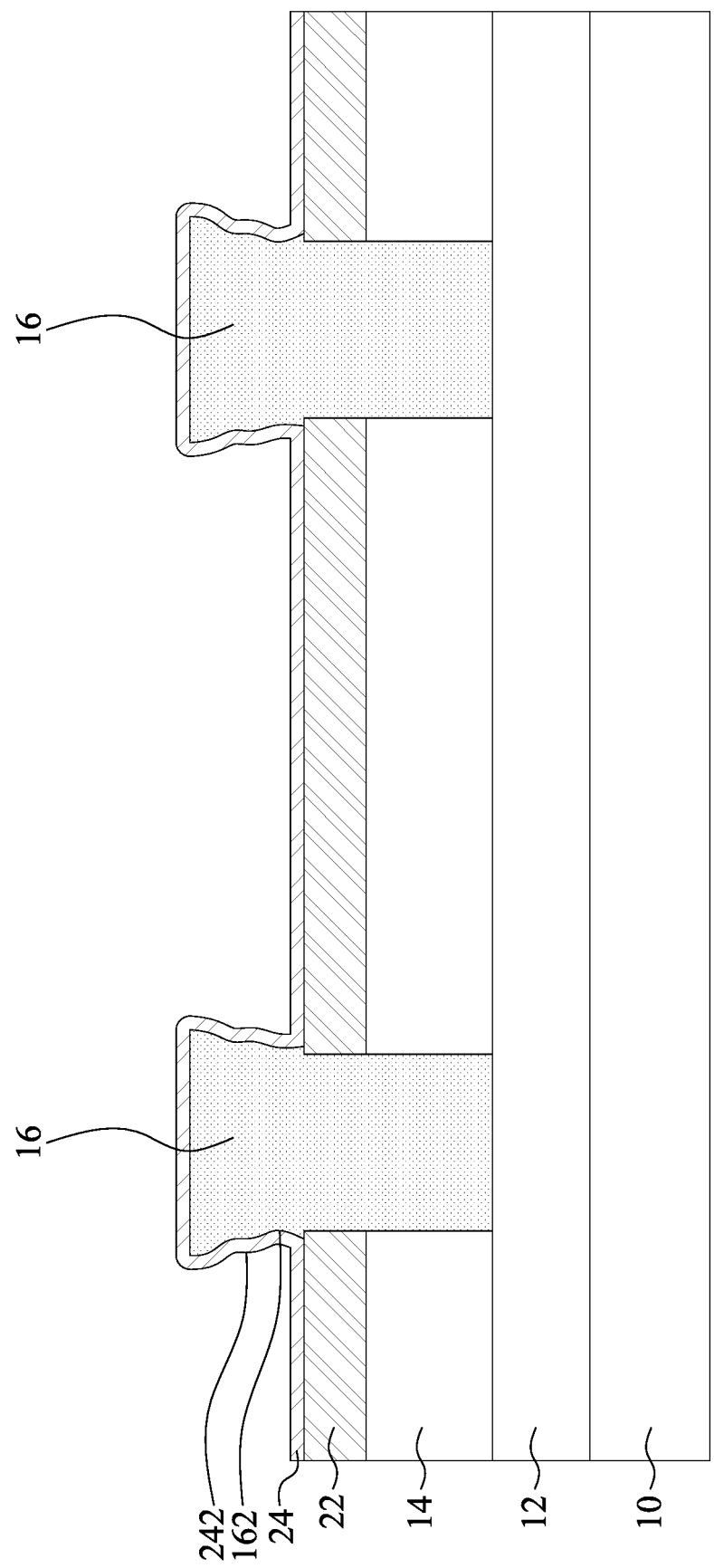

Referring to FIG. 5D, a passivation layer 24 is formed. The passivation layer 24 may be formed through CVD and/or another suitable deposition step. The passivation layer 24 may be disposed on the passivation layer 22. The passivation layer 24 may be disposed on the conductive structure 16. The passivation layer 24 may conformally cover the passivation layer 22. The passivation layer 24 may conformally cover the conductive structure 16. The passivation layer 24 may be formed to have a surface 242. The surface 242 may have an even surface. The surface 242 may have an uneven surface similar to the sidewall 162.

Figure 5E:
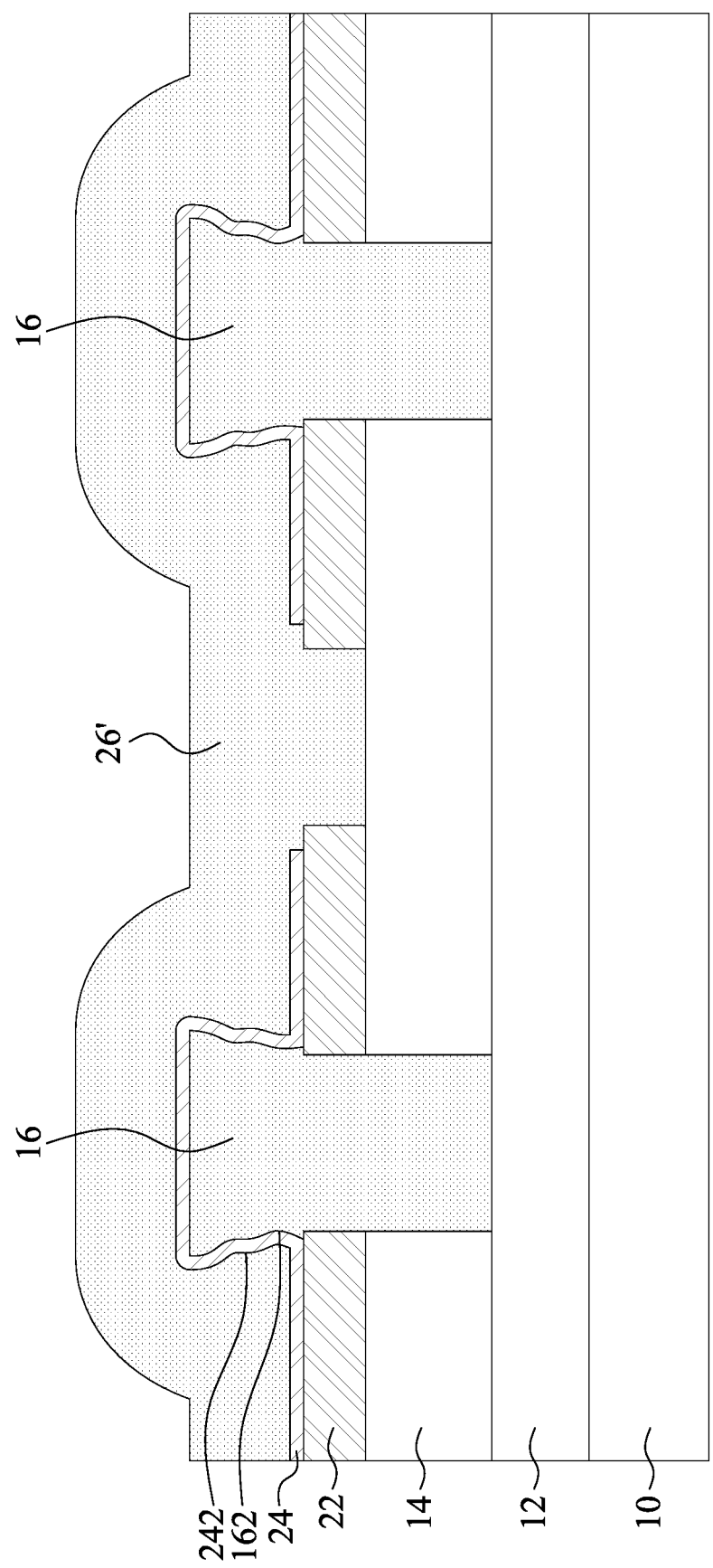

Referring to FIG. 5E, a conductive layer 26' is formed. The conductive layer 26' may be disposed on the passivation layer 24. The conductive layer 26' may be disposed on the semiconductor layer 14. The conductive layer 26' may be surrounded by the passivation layer 22 by etching a portion of the passivation layer 22. In some embodiments, the conductive layer 26' may be formed through CVD and/or another suitable deposition step. In some embodiments, the conductive layer 26' may be formed on the passivation layer 24 through CVD and/or another suitable deposition step.

Figure 5F:
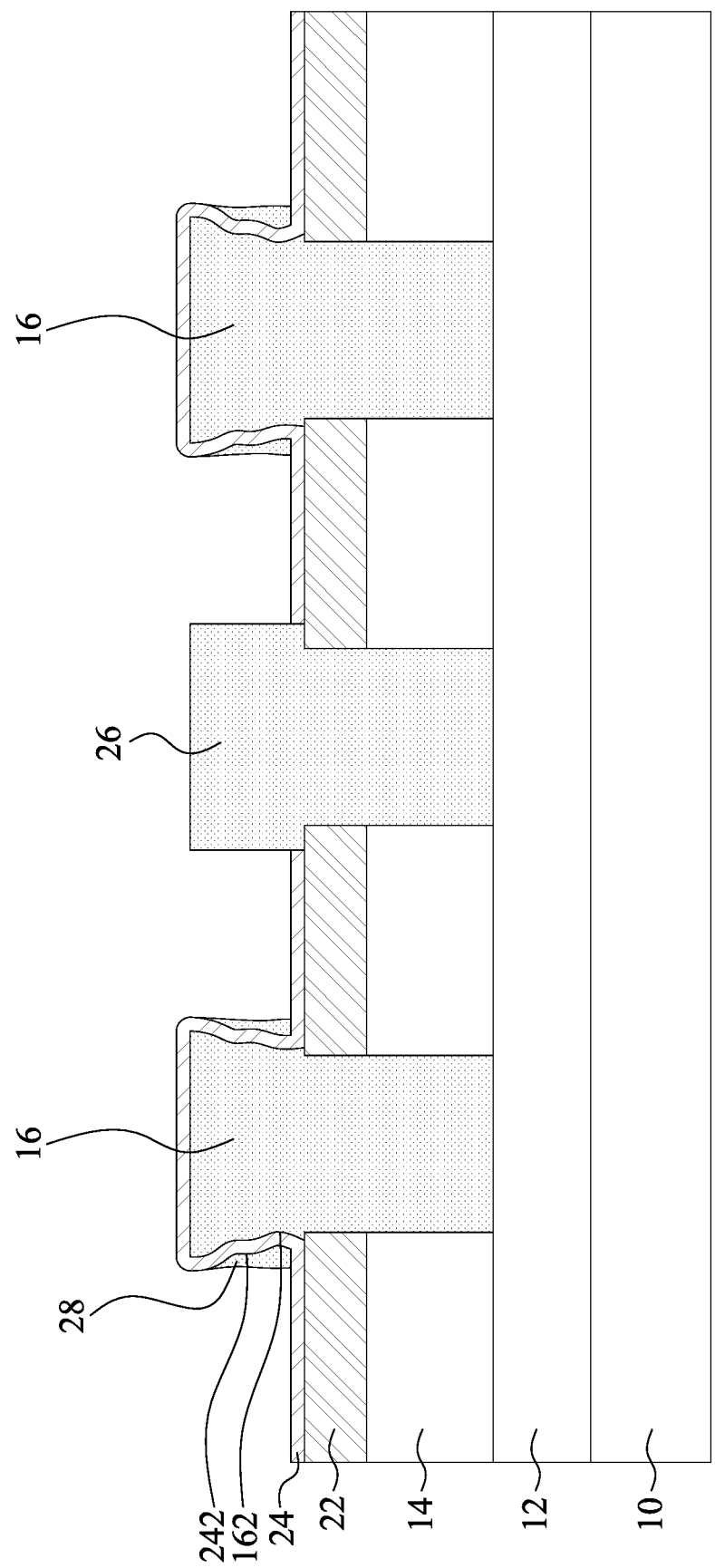

Referring to FIG. 5F, a conductive structure 26 is formed. The conductive structure 26 may be patterned. The conductive structure 26 may be patterned by etching a portion of the conductive layer 26' shown in FIG. 5E. A residue 28 may be formed when etching the conductive layer 26' shown in FIG. 5E.

It should be noted that, when forming the conductive structure 26, the residue 28 may be left on the surface 242. When forming the conductive structure 26, the residue 28 may be left on the uneven surface 242. The residue 28 from the conductive layer 26' shown in FIG. 5E may be left on the surface 242. It should be noted that, when forming the conductive structure 26, the residue 28 may be attached to the surface 242. When forming the conductive structure 26, the residue 28 may be attached to the uneven surface 242. The residue 28 from the conductive layer 26' shown in FIG. 5E may be attached to the surface 242.

As used herein, for ease of description, space-related terms such as "under", "below", "lower portion", "above", "upper portion", "lower portion", "left side", "right side", and the like may be used herein to describe a relationship between one component or feature and another component or feature as shown in the figures. In addition to orientations shown in the figures, space-related terms are intended to encompass different orientations of the device in use or operation. A device may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, terms "approximately", "basically", "substantially", and "about" are used for describing and considering a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all the ranges disclosed in the disclosure include endpoints. The term "substantially coplanar" may refer to two surfaces within a few micrometers (µm) positioned along the same plane, for example, within 10 µm, within 5 µm, within 1 µm, or within 0.5 µm located along the same plane. When reference is made to "substantially" the same numerical value or characteristic, the term may refer to a value within ±10%, ±5%, ±1%, or ±0.5% of the average of the values.

Several embodiments of the disclosure and features of details are briefly described above. The embodiments described in the disclosure may be easily used as a basis for designing or modifying other processes and structures for realizing the same or similar objectives and/or obtaining the same or similar advantages introduced in the embodiments of the disclosure. Such equivalent constructions do not depart from the spirit and scope of the disclosure, and various variations, replacements, and modifications can be made without departing from the spirit and scope of the disclosure.

What is claimed is:

1. A semiconductor device, comprising:
   a substrate;
   a first nitride semiconductor layer disposed on the substrate;
   a second nitride semiconductor layer disposed on the first nitride semiconductor layer and having a bandgap greater than that of the first nitride semiconductor layer;
   an ohmic contact disposed on the first nitride semiconductor layer; and
   a spacer disposed adjacent to a sidewall of the ohmic contact;
   wherein a void is enclosed by the sidewall of the ohmic contact and a first surface of the spacer adjacent to the sidewall of the ohmic contact.

2. The semiconductor device according to claim 1, wherein the sidewall of the ohmic contact has a rough surface.

3. The semiconductor device according to claim 2, wherein the first surface of the spacer adjacent to the sidewall of the ohmic contact has a smooth surface.

4. The semiconductor device according to claim 1, wherein the first surface of the spacer adjacent to the sidewall of the ohmic contact has a rough surface than a second surface of the spacer.

5. The semiconductor device according to claim 4, wherein the first surface of the spacer is substantially in contact with the sidewall of the ohmic contact.

6. The semiconductor device according to claim 1, wherein the spacer has a convex surface.

7. The semiconductor device according to claim 6, wherein the void is enclosed by the sidewall of the ohmic contact, the first surface of the spacer and a surface of the first passivation layer.

8. The semiconductor device according to claim 1, further comprising a first passivation layer disposed between the second nitride semiconductor layer and the spacer.

9. The semiconductor device according to claim 8, wherein the void is enclosed by the ohmic contact, the spacer and the first passivation layer.

10. The semiconductor device according to claim 9, wherein the sidewall of the ohmic contact has a rough surface, the first surface of the spacer has a smooth surface and the surface of the first passivation layer has a smooth surface.

11. The semiconductor device according to claim 1, wherein the spacer covers both sidewalls of the ohmic contact.

12. The semiconductor device according to claim 1, wherein the spacer encloses the ohmic contact.

13. A semiconductor device, comprising:
    a substrate;
    a first nitride semiconductor layer disposed on the substrate;
    a second nitride semiconductor layer disposed on the first nitride semiconductor layer and having a bandgap greater than that of the first nitride semiconductor layer;
    an ohmic contact disposed on the first nitride semiconductor layer;
    a first passivation layer disposed on the second nitride semiconductor layer; and
    a second passivation layer disposed on the ohmic contact and the first passivation layer;
    wherein a void is enclosed by the ohmic contact and the second passivation layer.

14. The semiconductor device according to claim 13, wherein the void is enclosed by a sidewall of the ohmic contact and a surface of the second passivation layer.

15. The semiconductor device according to claim 13, wherein a sidewall of the ohmic contact adjacent to the second passivation layer has a rough surface.

16. The semiconductor device according to claim 15, wherein a surface of the second passivation layer adjacent to the sidewall of the ohmic contact has a smooth surface.

* * * * *